(12) United States Patent
Matsumiya et al.

(10) Patent No.: US 9,169,421 B2
(45) Date of Patent: Oct. 27, 2015

(54) METHOD OF PRODUCING STRUCTURE CONTAINING PHASE-SEPARATED STRUCTURE, METHOD OF FORMING PATTERN, AND TOP COAT MATERIAL

(71) Applicants: Tokyo Ohka Kogyo Co., Ltd., Kawasaki-shi (JP); Tokyo Institute of Technology, Tokyo (JP)

(72) Inventors: Tasuku Matsumiya, Kawasaki (JP); Takehiro Seshimo, Kawasaki (JP); Katsumi Ohmori, Kawasaki (JP); Ken Miyagi, Kawasaki (JP); Daiju Shiono, Kawasaki (JP); Kenichiro Miyashita, Kawasaki (JP); Tsuyoshi Kurosawa, Kawasaki (JP); Teruaki Hayakawa, Tokyo (JP)

(73) Assignees: TOKYO OHKA KOGYO CO., LTD., Kawasaki-Shi (JP); TOKYO INSTITUTE OF TECHNOLOGY, Tokyo (JP)

( * ) Notice: Subject to any disclaimer, the term of this patent is extended or adjusted under 35 U.S.C. 154(b) by 0 days.

(21) Appl. No.: 14/185,052

(22) Filed: Feb. 20, 2014

(65) Prior Publication Data
US 2014/0238954 A1    Aug. 28, 2014

(30) Foreign Application Priority Data

Feb. 22, 2013    (JP) .................................. 2013-033563

(51) Int. Cl.
*G03F 7/004*   (2006.01)
*G03F 7/40*    (2006.01)
*C09D 183/10*  (2006.01)
(Continued)

(52) U.S. Cl.
CPC .......... *C09D 183/10* (2013.01); *B81C 1/00031* (2013.01); *B82Y 40/00* (2013.01); *C08G 18/61* (2013.01); *C09D 153/00* (2013.01);
(Continued)

(58) Field of Classification Search
CPC .. G03F 7/0002; B82Y 40/00; B81C 1/00031; B81C 2201/0149; B81C 2201/0198; B81C 1/00531; C08G 18/61; C08G 77/38
USPC .................. 427/261, 258; 430/322, 330, 331; 216/67
See application file for complete search history.

(56) References Cited

U.S. PATENT DOCUMENTS 8,168,284 B2 *   5/2012   Nealey et al. .................. 428/137
8,501,304 B2 *   8/2013   Stoykovich et al. ....... 428/195.1
(Continued)

OTHER PUBLICATIONS

Hirai et al, "One-Step Direct-Patterning Template Utilizinf Self-Assembly of POSS-Containing Blocl Copolymers", Advances Materials, 21,4334-4338 (2009).*
(Continued)

*Primary Examiner* — Amanda C Walke
(74) *Attorney, Agent, or Firm* — Knobbe Martens Olson & Bear LLP

(57) ABSTRACT

A method of producing a structure containing a phase-separated structure, including forming, on a substrate, a layer containing a block copolymer having a block of a polyhedral oligomeric silsesquioxane structure-containing structural unit; forming a top coat film by applying, to the layer containing the block copolymer, a top coat material which undergoes a change in polarity upon heating, and controls a surface energy of the layer containing the block copolymer; and subjecting the layer containing the block copolymer on which the top coat film is formed to phase separation by thermal annealing.

12 Claims, 2 Drawing Sheets

(51) Int. Cl.
   *G03F 7/00* (2006.01)
   *B81C 1/00* (2006.01)
   *C08G 18/61* (2006.01)
   *B82Y 40/00* (2011.01)
   *C09D 153/00* (2006.01)
   *C08G 77/04* (2006.01)
   *C08G 77/442* (2006.01)

(52) U.S. Cl.
   CPC ....... *G03F 7/0002* (2013.01); *B81C 2201/0149* (2013.01); *C08G 77/045* (2013.01); *C08G 77/442* (2013.01)

(56) References Cited

U.S. PATENT DOCUMENTS

| | | | |
|---|---|---|---|
| 8,597,630 B2* | 12/2013 | Song et al. | 424/78.08 |
| 2012/0083523 A1* | 4/2012 | Richard et al. | 514/449 |
| 2013/0209757 A1* | 8/2013 | Willson et al. | 428/195.1 |
| 2013/0280497 A1* | 10/2013 | Wilson et al. | 428/195.1 |
| 2013/0344242 A1* | 12/2013 | Willson et al. | 427/240 |
| 2014/0255333 A1* | 9/2014 | Song et al. | 424/78.18 |
| 2014/0273514 A1* | 9/2014 | Somervell et al. | 438/763 |
| 2014/0377518 A1* | 12/2014 | Trefonas et al. | 428/212 |
| 2015/0034593 A1* | 2/2015 | Matsumiya et al. | 216/47 |

OTHER PUBLICATIONS

Tada et al., "Directed Self-Assembly of POSS Containing Block Copolymer on Lithographically Defined Chemical Template With Morphology Control by Solvent Vapor," Macromolecules, 45, pp. 292-304, 2012.

* cited by examiner

METHOD OF PRODUCING STRUCTURE CONTAINING PHASE-SEPARATED STRUCTURE, METHOD OF FORMING PATTERN, AND TOP COAT MATERIAL

RELATED APPLICATIONS

This application claims priority under 35 U.S.C. §119(a)-(d) to Japanese Patent Application No. 2013-033563, filed Feb. 22, 2013, the content of which is incorporated herein by reference.

TECHNICAL FIELD

The present invention relates to a method of producing a structure containing a phase-separated structure, a method of forming a pattern, and a top coat material.

BACKGROUND ART

In recent years, the continued miniaturization of large scale integrated circuits (LSI) has lead to demands for techniques capable of processing ever finer structures. In response to these types of demands, testing has commenced into the formation of finer patterns using phase-separated structures that are formed by the self-assembly of a block copolymer containing mutually incompatible blocks bonded together.

In order to utilize this type of phase-separated structure of a block copolymer, a self-assembled nanostructure formed by microphase separation must be formed within only a specific region, and must be oriented in the required direction. In order to achieve this positional control and orientation control, processes such as graphoepitaxy, which controls the phase-separated pattern using a guide pattern, and chemical epitaxy, which controls the phase-separated pattern based on differences in the chemical state of the substrate, have been proposed.

For these block copolymers, block copolymers having a block formed from a repeating unit of a styrene and a block formed from a repeating unit of methyl methacrylate (PS-b-PMMA) are being widely investigated, and it is claimed that PS-b-PMMA is a material that can be used in the formation of very fine patterns down to approximately 13 nm.

Further, investigations are currently also being conducted into pattern formation methods using Si-containing block copolymers, which have been identified as materials potentially capable of realizing the formation of patterns of even finer dimensions. Block copolymer layers formed using these Si-containing block copolymers have low surface energy. Consequently, during the self-assembly of the block copolymer, controlling the surface state of the block copolymer layer is very important.

Accordingly, a method is being investigated in which phase separation is achieved by subjecting the block copolymer layer to an annealing treatment in a solvent atmosphere (solvent annealing). For example, a method of forming a pattern has been disclosed which uses a phase-separated structure obtained by forming a block copolymer layer having a block of a polyhedral oligomeric silsesquioxane (POSS) structure-containing structural unit on a substrate, and then subjecting the block copolymer layer to phase separation by carbon disulfide ($CS_2$) solvent annealing (see Non-Patent Document 1).

DOCUMENTS OF RELATED ART

Non-Patent Documents

Non-Patent Document 1: Macromolecules 2012, 45, 292 to 304

SUMMARY OF THE INVENTION

Problems to be Solved by the Invention

However, in the method disclosed in Non-Patent Document 1 in which a block copolymer layer having a block of a POSS structure-containing structural unit is subjected to phase separation by solvent annealing, considerable time is required for the formation of the phase-separated structure by self-assembly of the block copolymer, meaning there is a problem in terms of throughput. In addition, the applicability to mass production is poor.

The present invention has been developed in light of the above circumstances, and has an object of providing a method of producing a structure containing a phase-separated structure of a block copolymer which offers improved throughput and mass producibility.

Means to Solve the Problems

In order to achieve the above object, the present invention adopts the following aspects.

In other words, a first aspect of the present invention is a method of producing a structure containing a phase-separated structure, the method including a step (1) of forming, on a substrate, a layer containing a block copolymer having a block of a polyhedral oligomeric silsesquioxane structure-containing structural unit, a step (2) of forming a top coat film by applying, to the layer containing the block copolymer, a top coat material which undergoes a change in polarity upon heating and controls the surface energy of the layer containing the block copolymer, and a step (3) of subjecting the layer containing the block copolymer with the top coat film formed thereon to phase separation by thermal annealing.

A second aspect of the present invention is a method of forming a pattern, the method including a step (4) of forming a pattern by selectively removing a phase composed of at least one type of block from the structure containing a phase-separated structure produced using the method of the first aspect.

A third aspect of the present invention is a top coat material that can be used in the production method of the first aspect, the top coat material containing a polymeric compound having a structural unit (Tc1) which undergoes a change in polarity upon heating, and a surface energy control agent which controls the surface energy of the layer containing the block copolymer.

A fourth aspect of the present invention is a top coat material that can be used in the production method of the first aspect, the top coat material containing a polymeric compound having a structural unit (Tc1) which undergoes a change in polarity upon heating and a structural unit (Tc2) which controls the surface energy of the layer containing the block copolymer.

Effects of the Invention

The present invention is able to provide a method of producing a structure containing a phase-separated structure of a block copolymer which offers improved throughput and mass producibility.

In addition, the present invention can also provide a method of forming a pattern from a structure containing the phase-separated structure produced by the above method of producing a structure, and a top coat material that is ideal for use in the method of producing a structure.

EMBODIMENTS FOR CARRYING OUT THE INVENTION

Figure 1:
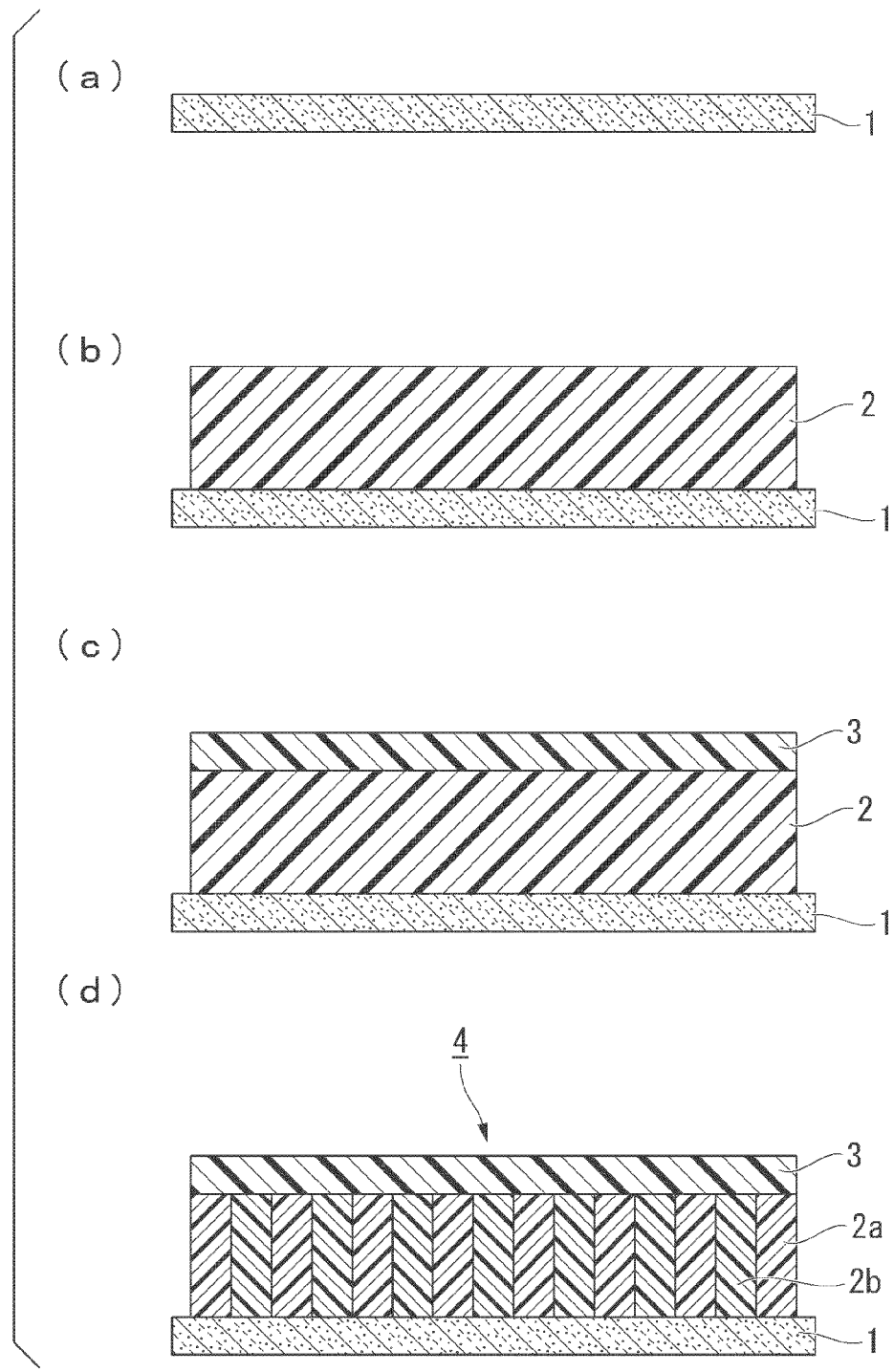
FIG. 1 is a schematic process diagram describing one embodiment of the method of producing a structure containing a phase-separated structure according to the present invention.

In the present description and the claims, the term "aliphatic" is a relative concept used in relation to the term "aromatic", and defines a group or compound or the like that has no aromaticity.

The term "alkyl group" includes linear, branched and cyclic monovalent saturated hydrocarbon groups, unless specified otherwise. This definition also applies to the alkyl group within an alkoxy group.

The term "alkylene group" includes linear, branched and cyclic divalent saturated hydrocarbon groups, unless specified otherwise.

A "halogenated alkyl group" is a group in which part or all of the hydrogen atoms of an alkyl group have each been substituted with a halogen atom, wherein examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or alkylene group have each been substituted with a fluorine atom.

The term "structural unit" refers to a monomer unit that contributes to the formation of a polymeric compound (a resin, polymer or copolymer).

The expression "may have a substituent" includes both the case in which a hydrogen atom (—H) is substituted with a monovalent group, and the case in which a methylene group (—CH$_2$—) is substituted with a divalent group.

The term "exposure" is used as a general concept that includes irradiation with any form of radiation.

The expression "structural unit derived from an acrylate ester" refers to a structural unit that is formed by the cleavage of the ethylenic double bond of an acrylate ester.

An "acrylate ester" is a compound in which the hydrogen atom at the carboxyl group terminal of acrylic acid (CH$_2$=CH—COOH) has been substituted with an organic group.

In an acrylate ester, the hydrogen atom bonded to the carbon atom on the α-position may be substituted with a substituent. This substituent ($R^{\alpha 0}$) for substituting the hydrogen atom bonded to the carbon atom on the α-position is an atom or group other than a hydrogen atom, and examples include an alkyl group of 1 to 5 carbon atoms and a halogenated alkyl group of 1 to 5 carbon atoms. Further, the term "acrylate ester" is also deemed to include itaconate diesters in which the substituent ($R^{\alpha 0}$) is substituted with a substituent containing an ester linkage, and α-hydroxyacrylate esters in which the substituent ($R^{\alpha 0}$) is substituted with a hydroxyalkyl group or a group in which the hydroxyl group of such a hydroxyalkyl group has been modified. The carbon atom on the α-position of an acrylate ester refers to the carbon atom to which the carbonyl group of the acrylic acid is bonded, unless specified otherwise.

Hereafter, an acrylate ester in which the hydrogen atom bonded to the carbon atom on the α-position has been substituted with a substituent is sometimes referred to as an "α-substituted acrylate ester". Further, the generic term "(α-substituted) acrylate ester" may be used to describe both the acrylate ester and the α-substituted acrylate ester.

The expression "structural unit derived from an acrylamide" refers to a structural unit that is formed by the cleavage of the ethylenic double bond of an acrylamide.

In an acrylamide, the hydrogen atom bonded to the carbon atom on the α-position may be substituted with a substituent, and one or both of the hydrogen atoms of the amino group of the acrylamide may each be substituted with a substituent. The carbon atom on the α-position of an acrylamide refers to the carbon atom to which the carbonyl group of the acrylamide is bonded, unless specified otherwise.

Examples of the substituent which may substitute the hydrogen atom bonded to the carbon atom on the α-position of an acrylamide include the same substituents as those mentioned above as the α-position substituent in the aforementioned α-substituted acrylate ester (namely, the substituent ($R^{\alpha 0}$)).

The expression "structural unit derived from a hydroxystyrene or hydroxystyrene derivative" refers to a structural unit that is formed by the cleavage of the ethylenic double bond of a hydroxystyrene or a hydroxystyrene derivative.

The term "hydroxystyrene derivative" is a generic term that includes both compounds in which the α-position hydrogen atom of a hydroxystyrene has been substituted with another substituent such as an alkyl group or a halogenated alkyl group, as well as derivatives thereof. Examples of these derivatives include compounds in which the hydrogen atom of the hydroxyl group of a hydroxystyrene, in which the α-position hydrogen atom may be substituted with a substituent, has been substituted with an organic group, and compounds in which a substituent other than a hydroxyl group is bonded to the benzene ring of a hydroxystyrene in which the α-position hydrogen atom may be substituted with a substituent. Furthermore, unless stated otherwise, the α-position (the carbon atom on the α-position) refers to the carbon atom to which the benzene ring is bonded.

Examples of the substituent which may substitute the α-position hydrogen atom of a hydroxystyrene include the same substituents as those mentioned above as the α-position substituent in the aforementioned α-substituted acrylate ester.

The expression "structural unit derived from a vinylbenzoic acid or vinylbenzoic acid derivative" refers to a structural unit that is formed by the cleavage of the ethylenic double bond of a vinylbenzoic acid or a vinylbenzoic acid derivative.

The term "vinylbenzoic acid derivative" is a generic term that includes both compounds in which the α-position hydrogen atom of a vinylbenzoic acid has been substituted with another substituent such as an alkyl group or a halogenated alkyl group, as well as derivatives thereof. Examples of these derivatives include compounds in which the hydrogen atom of the carboxyl group of a vinylbenzoic acid, in which the α-position hydrogen atom may be substituted with a substituent, has been substituted with an organic group, and compounds in which a substituent other than a hydroxyl group or a carboxyl group is bonded to the benzene ring of a vinylbenzoic acid in which the α-position hydrogen atom may be substituted with a substituent. Furthermore, unless stated otherwise, the α-position (the carbon atom on the α-position) refers to the carbon atom to which the benzene ring is bonded.

The term "styrene" is a generic term that includes styrene, and compounds in which the α-position hydrogen atom of styrene has been substituted with another substituent such as an alkyl group or a halogenated alkyl group.

The expressions "structural unit derived from a styrene" and "structural unit derived from a styrene derivative" refer to structural units that are formed by the cleavage of the ethylenic double bond of a styrene or a styrene derivative.

The alkyl group as the α-position substituent is preferably a linear or branched alkyl group, and specific examples include alkyl group of 1 to 5 carbon atoms (a methyl group, ethyl group, propyl group, isopropyl group, n-butyl group, isobutyl group, tert-butyl group, pentyl group, isopentyl group and neopentyl group).

Further, specific examples of the halogenated alkyl group as the α-position substituent include groups in which part or all of the hydrogen atoms of an aforementioned "alkyl group as the α-position substituent" have each been substituted with a halogen atom. Examples of the halogen atom include a fluorine atom, chlorine atom, bromine atom and iodine atom, and a fluorine atom is particularly desirable.

Furthermore, specific examples of the hydroxyalkyl group as the α-position substituent include groups in which part or all of the hydrogen atoms of an aforementioned "alkyl group as the α-position substituent" have each been substituted with a hydroxyl group. The number of hydroxyl groups in the hydroxyalkyl group is preferably from 1 to 5, and is most preferably 1.

<<Method of Producing Structure Containing Phase-Separated Structure>>

The first aspect of the present invention is a method of producing a structure containing a phase-separated structure, the method including a step (1) of forming, on a substrate, a layer containing a block copolymer having a block of a polyhedral oligomeric silsesquioxane structure-containing structural unit, a step (2) of forming a top coat film by applying, to the layer, a top coat material which undergoes a change in polarity upon heating and controls the surface energy of the layer containing the block copolymer, and a step (3) of subjecting the layer containing the block copolymer with the top coat film formed thereon to phase separation by thermal annealing.

The method of producing a structure containing a phase-separated structure of this aspect is described below with reference to the drawings. However, the present invention is not limited to the following description.

FIG. 1 illustrates one embodiment of the method of producing a structure containing a phase-separated structure according to the present aspect.

In this embodiment, a block copolymer having a block of a polyhedral oligomeric silsesquioxane (POSS) structure-containing structural unit is used. In FIG. 1, among the plurality of types of blocks that constitute the block copolymer, the block that is not selectively removed following the phase separation is referred to as the $P_A$ block, and the block that is selectively removed is referred to as the $P_B$ block.

First, a substrate 1 is prepared (FIG. 1(a)).

Subsequently, a resin composition containing a block copolymer in which a block of a POSS structure-containing structural unit and another block are bonded together is used to form a layer 2 containing the block copolymer (FIG. 1(b), step (1)).

Next, a specific top coat material is applied to the layer 2, thus forming a top coat film 3 (FIG. 1(c), step (2)).

Subsequently, a thermal annealing treatment is performed for the layer 2 having the top coat film 3 formed thereon. This causes self-assembly of the block copolymer to proceed, resulting in a phase separation into a phase 2a composed of the $P_B$ block and a phase 2b composed of the $P_A$ block, thus completing production of a structure 4 containing a phase-separated structure (FIG. 1(d), step (3)).

<Step (1)>

In step (1), the layer containing the block copolymer having a block of the polyhedral oligomeric silsesquioxane (POSS) structure-containing structural unit is formed on the substrate.

In the present embodiment, formation of the layer 2 containing the block copolymer can be implemented, for example, by applying a block copolymer solution, prepared by dissolving the block copolymer having a block of the POSS structure-containing structural unit in an organic solvent, to the substrate 1 by spin coating or the like. A bake treatment may be performed following this application. In such cases, the heating temperature is preferably from 80 to 280° C., and the heating time is preferably from 10 to 600 seconds.

The thickness of the layer 2 containing the block copolymer formed on the substrate 1 may be determined appropriately in accordance with the molecular weight and the polymer period of the block copolymer, but is generally within a range from 0.5 to 4 times the polymer period. In the present embodiment, the thickness of the layer 2 may be any thickness sufficient to allow phase separation to occur, and more specifically, if due consideration is given to the strength and uniformity and the like of the phase-separated structure, then the thickness is preferably 3 nm or greater, and more preferably from 10 to 40 nm.

(Block Copolymer Solution)

The block copolymer solution is obtained by dissolving the block copolymer having a block of the POSS structure-containing structural unit in an organic solvent.

The solid fraction concentration of the block copolymer within the block copolymer solution is preferably from 0.1 to 70% by weight, and more preferably from 0.1 to 50% by weight. Provided the concentration of the block copolymer is at least as high as the preferred lower limit, the block copolymer solution can be easily applied uniformly to the substrate. On the other hand, provided the concentration is not more than the preferred upper limit, the liquid stability of the block copolymer solution can be readily maintained.

—Block Copolymer

The block copolymer is a polymer in which a plurality of types of blocks (partial structural components in which structural units of the same type are bonded repeatedly together) are bonded together. The number of types of blocks that constitute the block copolymer may be either 2 types, or 3 or more types.

In the present aspect, although the plurality of types of blocks that constitute the block copolymer are not particularly limited, provided they represent a combination capable of undergoing phase separation, it is preferable to use a combination of blocks which are mutually incompatible. Further, it is preferable to use a combination in which a phase composed of at least one type of block among the plurality of types of block that constitute the block copolymer can be selectively removed more easily than the phase(s) composed of the other type(s) of block(s).

In the present invention, the "period of the block copolymer" refers to the period of the phase structure observed when the phase-separated structure has been formed, and represents the sum of the length of each of the mutually incompatible phases. The period of the block copolymer corresponds with the length of one molecule of the block copolymer.

The period of the block copolymer is determined by the intrinsic polymer characteristics such as the polymerization degree N and the Flory-Huggins interaction parameter $\chi$. In other words, as the value of $\chi N$ increases, the mutual repulsion between different blocks in the block copolymer increases. As a result, when $\chi N > 10$ (hereafter referred to as the "strong separation limit"), the repulsion between the different types of blocks in the block copolymer is large, and the tendency for phase separation to occur strengthens. At the strong separation limit, the period of the block copolymer is approximately $N^{2/3} \chi^{1/6}$. In other words, the period of the block copolymer is proportional to the polymerization degree, which correlates with the molecular weight Mn and the molecular weight ratio between the different blocks. Accordingly, by adjusting the composition and the total molecular weight of the block copolymer used, the period of the block copolymer can be easily adjusted. Further, it is thought that in order to produce a finer phase-separated structure, it is advantageous to select a block copolymer having a low polymerization degree N (namely, a copolymer of small size) and a large interaction parameter $\chi$.

—Structural Unit (a0)

In step (1), a block copolymer having a block of a polyhedral oligomeric silsesquioxane (POSS) structure-containing structural unit (hereafter also referred to as "the structural unit (a0)") is used.

By including a block of the POSS structure-containing structural unit, the interaction parameter $\chi$ of the block copolymer can be increased, which facilitates phase separation. In addition, the polymerization degree N can be reduced, which facilitates miniaturization of the phase-separated structure.

Examples of preferred POSS structures include groups represented by general formula (a0-r-1) shown below.

[Chemical Formula 1]

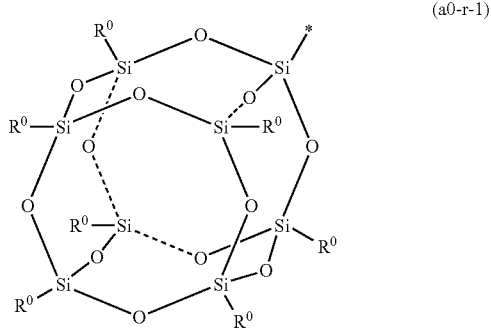

(a0-r-1)

In the formula, $R^0$ represents a monovalent hydrocarbon group which may have a substituent, wherein the plurality of $R^0$ groups may be the same or different, and * indicates the bonding position (this also applies below).

In formula (a0-r-1), the monovalent hydrocarbon group for $R^0$ preferably contains 1 to 20 carbon atoms, more preferably 1 to 10 carbon atoms, and still more preferably 1 to 8 carbon atoms. However, this number of carbon atoms does not include any carbon atoms within any of the substituents described below.

The monovalent hydrocarbon group for $R^0$ may be an aliphatic hydrocarbon group or an aromatic hydrocarbon group, but is preferably an aliphatic hydrocarbon group, and more preferably a monovalent aliphatic saturated hydrocarbon group (alkyl group).

More specific examples of the above alkyl group include chain-like aliphatic hydrocarbon groups (linear or branched alkyl groups), and aliphatic hydrocarbon groups that include a ring within the structure.

The linear alkyl group preferably contains 1 to 8 carbon atoms, more preferably 1 to 5 carbon atoms, and still more preferably 1 to 3 carbon atoms. Specific examples include a methyl group, ethyl group, n-propyl group, n-butyl group and n-pentyl group. Among these, a methyl group, ethyl group or n-propyl group is preferable, a methyl group, ethyl group or is more preferable, an ethyl group or is still more preferable, and an ethyl group is particularly desirable.

The branched alkyl group preferably contains 3 to 5 carbon atoms. Specific examples include an isopropyl group, isobutyl group, tert-butyl group, isopentyl group and neopentyl group, and an isopropyl group or tert-butyl group is the most desirable.

Examples of the aliphatic hydrocarbon group that includes a ring within the structure include cyclic aliphatic hydrocarbon groups (groups in which one hydrogen atom has been removed from an aliphatic hydrocarbon ring), groups in which such a cyclic aliphatic hydrocarbon group is bonded to the terminal of an aforementioned chain-like aliphatic hydrocarbon group, and groups in which a cyclic aliphatic hydrocarbon group is interposed within the chain of an aforementioned chain-like aliphatic hydrocarbon group.

The cyclic aliphatic hydrocarbon group preferably contains 3 to 8 carbon atoms, and more preferably 4 to 6 carbon atoms, and may be either a polycyclic group or a monocyclic group. The monocyclic group is preferably a group in which one or more hydrogen atoms have been removed from a monocycloalkane of 3 to 6 carbon atoms, and examples of the monocycloalkane include cyclopentane and cyclohexane. The polycyclic group is preferably a group in which one or more hydrogen atoms have been removed from a polycycloalkane of 7 to 12 carbon atoms, and specific examples of the polycycloalkane include adamantane, norbornane, isobornane, tricyclodecane and tetracyclododecane.

The chain-like aliphatic hydrocarbon group may have a substituent. Examples of this substituent include a fluorine atom, a fluorinated alkyl group of 1 to 5 carbon atoms, and an oxygen atom (=O).

The cyclic aliphatic hydrocarbon group may have a substituent. Examples of this substituent include an alkyl group of 1 to 5 carbon atoms, a fluorine atom, a fluorinated alkyl group of 1 to 5 carbon atoms, and an oxygen atom (=O).

When the monovalent hydrocarbon group for $R^0$ is an aromatic hydrocarbon group, the aromatic hydrocarbon group is a monovalent hydrocarbon group having at least one aromatic ring.

There are no particular limitations on this aromatic ring, provided it is a cyclic conjugated system having $4n+2\pi$ electrons, and the aromatic ring may be either monocyclic or polycyclic. The aromatic ring preferably contains 5 to 30 carbon atoms, more preferably 5 to 20 carbon atoms, still more preferably 6 to 15 carbon atoms, and particularly preferably 6 to 12 carbon atoms. This number of carbon atoms does not include any carbon atoms within any substituents described below.

Specific examples of the aromatic ring include aromatic hydrocarbon rings such as benzene, naphthalene, anthracene and phenanthrene, and aromatic heterocyclic rings in which a portion of the carbon atoms that constitute one of the above aromatic hydrocarbon rings has been substituted with a hetero atom. Examples of the hetero atom in the aromatic heterocyclic ring include an oxygen atom, a sulfur atom and a nitrogen atom. Specific examples of the aromatic heterocyclic ring include a pyridine ring and a thiophene ring.

Specific examples of the aromatic hydrocarbon group include groups in which one hydrogen atom has been removed from an aforementioned aromatic hydrocarbon ring or aromatic heterocyclic ring (namely, aryl groups or heteroaryl groups), groups in which one hydrogen atom has been removed from an aromatic compound having two or more aromatic rings (such as biphenyl or fluorene), and groups in which one of the hydrogen atoms of an aforementioned aromatic hydrocarbon ring or aromatic heterocyclic ring has been substituted with an alkylene group (for example, arylalkyl groups such as a benzyl group, phenethyl group, 1-naphthylmethyl group, 2-naphthylmethyl group, 1-naphthylethyl group or 2-naphthylethyl group).

The alkylene group bonded to the aryl group or heteroaryl group preferably contains 1 to 4 carbon atoms, more preferably 1 or 2 carbon atoms, and most preferably 1 carbon atom.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Examples of the POSS structure-containing structural unit (the structural unit (a0)) include structural units containing a POSS structure and derived from an acrylate ester in which the hydrogen atom bonded to the carbon atom on the α-position may be substituted with a substituent, structural units containing a POSS structure and derived from an acrylamide, structural units containing a POSS structure and derived from a hydroxystyrene or hydroxystyrene derivative, and structural units containing a POSS structure and derived from a vinylbenzoic acid or vinylbenzoic acid derivative.

Among these, the structural unit (a0) is preferably a structural unit derived from an acrylate ester in which the hydrogen atom bonded to the carbon atom on the α-position may be substituted with a substituent.

Specific examples of preferred structural units (a0) include structural units represented by general formula (a0-1) shown below.

[Chemical Formula 2]

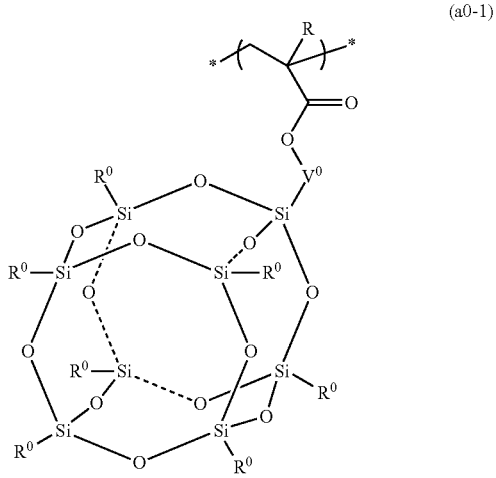

(a0-1)

In the formula, R represents a hydrogen atom, an alkyl group of 1 to 5 carbon atoms or a halogenated alkyl group of 1 to 5 carbon atoms, $V^0$ represents a divalent hydrocarbon group which may have a substituent, and $R^0$ represents a monovalent hydrocarbon group which may have a substituent, wherein the plurality of $R^0$ groups may be the same or different.

In formula (a0-1), the alkyl group of 1 to 5 carbon atoms for R is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group. The halogenated alkyl group of 1 to 5 carbon atoms is a group in which part or all of the hydrogen atoms of an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

R is preferably a hydrogen atom, an alkyl group of 1 to 5 carbon atoms or a fluorinated alkyl group of 1 to 5 carbon atoms, and from the viewpoint of ease of industrial availability, is most preferably a hydrogen atom or a methyl group.

In formula (a0-1), $R^0$ is the same as $R^0$ in the aforementioned formula (a0-r-1).

In formula (a0-1), the divalent hydrocarbon group for $V^0$ may be an aliphatic hydrocarbon group or an aromatic hydrocarbon group. An aliphatic hydrocarbon group is a hydrocarbon group that has no aromaticity.

The aliphatic hydrocarbon group as the divalent hydrocarbon group for $V^0$ may be saturated or unsaturated, but in general, is preferably saturated.

More specific examples of the aliphatic hydrocarbon group include linear or branched aliphatic hydrocarbon groups, and aliphatic hydrocarbon groups that include a ring within the structure.

The linear or branched aliphatic hydrocarbon group preferably has 1 to 10 carbon atoms, more preferably 1 to 6 carbon atoms, still more preferably 1 to 4 carbon atoms, and most preferably 1 to 3 carbon atoms.

The linear aliphatic hydrocarbon group is preferably a linear alkylene group, and specific examples include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

The branched aliphatic hydrocarbon group is preferably a branched alkylene group, and specific examples include alkylalkylene groups, including alkylmethylene groups such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)— and —C($CH_2CH_3$)$_2$—, alkylethylene groups such as —CH($CH_3$)$CH_2$—, —CH($CH_3$)CH($CH_3$)—, —C($CH_3$)$_2CH_2$—, —CH($CH_2CH_3$)$CH_2$— and —C($CH_2CH_3$)$_2$—$CH_2$—, alkyltrimethylene groups such as —CH($CH_3$)$CH_2CH_2$— and —$CH_2$CH($CH_3$)$CH_2$—, and alkyltetramethylene groups such as —CH($CH_3$)$CH_2CH_2CH_2$— and —$CH_2$CH($CH_3$)$CH_2CH_2$—. The alkyl group within the alkylalkylene group is preferably a linear alkyl group of 1 to 5 carbon atoms.

Examples of the aliphatic hydrocarbon group that includes a ring within the structure include alicyclic hydrocarbon groups (groups in which two hydrogen atoms have been removed from an aliphatic hydrocarbon ring), groups in which an alicyclic hydrocarbon group is bonded to the terminal of a linear or branched aliphatic hydrocarbon group, and groups in which an alicyclic hydrocarbon group is interposed within the chain of a linear or branched aliphatic hydrocarbon group. Examples of the linear or branched aliphatic hydrocarbon group include the same groups as those mentioned above.

The alicyclic hydrocarbon group preferably contains 3 to 20 carbon atoms, and more preferably 3 to 12 carbon atoms.

The alicyclic hydrocarbon group may be a polycyclic group or a monocyclic group. The monocyclic alicyclic hydrocarbon group is preferably a group in which two hydrogen atoms have been removed from a monocycloalkane. The monocycloalkane preferably contains 3 to 6 carbon atoms, and specific examples include cyclopentane and cyclohexane.

The polycyclic alicyclic hydrocarbon group is preferably a group in which two hydrogen atoms have been removed from a polycycloalkane, and the polycycloalkane preferably has 7 to 12 carbon atoms. Specific examples of the polycycloalkane include adamantane, norbornane, isobornane, tricyclodecane and tetracyclododecane.

The aromatic hydrocarbon group is a hydrocarbon group having an aromatic ring.

There are no particular limitations on this aromatic ring, provided it is a cyclic conjugated system having $4n+2\pi$ electrons, and the aromatic ring may be either monocyclic or polycyclic. The aromatic ring preferably contains 5 to 30 carbon atoms, more preferably 5 to 20 carbon atoms, still more preferably 6 to 15 carbon atoms, and particularly preferably 6 to 12 carbon atoms. This number of carbon atoms does not include any carbon atoms within any substituents described below.

Specific examples of the aromatic ring include aromatic hydrocarbon rings such as benzene, naphthalene, anthracene and phenanthrene, and aromatic heterocyclic rings in which a portion of the carbon atoms that constitute one of the above aromatic hydrocarbon rings has been substituted with a hetero atom. Examples of the hetero atom in the aromatic heterocyclic ring include an oxygen atom, a sulfur atom and a nitrogen atom. Specific examples of the aromatic heterocyclic ring include a pyridine ring and a thiophene ring.

Specific examples of the aromatic hydrocarbon group include groups in which two hydrogen atoms have been removed from an aromatic hydrocarbon ring or an aromatic heterocyclic ring (namely, arylene groups or heteroarylene groups), groups in which two hydrogen atoms have been removed from an aromatic compound having two or more aromatic rings (such as biphenyl or fluorene), and groups in which one hydrogen atom of a group having one hydrogen atom removed from an aforementioned aromatic hydrocarbon ring or aromatic heterocyclic ring (namely, an aryl group or heteroaryl group) has been substituted with an alkylene group (for example, groups in which a further one hydrogen atom has been removed from the aryl group of an arylalkyl group such as a benzyl group, phenethyl group, 1-naphthylmethyl group, 2-naphthylmethyl group, 1-naphthylethyl group or 2-naphthylethyl group).

The alkylene group bonded to the aryl group or heteroaryl group preferably contains 1 to 4 carbon atoms, more preferably 1 or 2 carbon atoms, and most preferably 1 carbon atom.

Specific examples of the structural unit represented by formula (a0-1) are shown below. In each of the following formulas, $R^\alpha$ represents a hydrogen atom, a methyl group or a trifluoromethyl group.

[Chemical Formula 3]

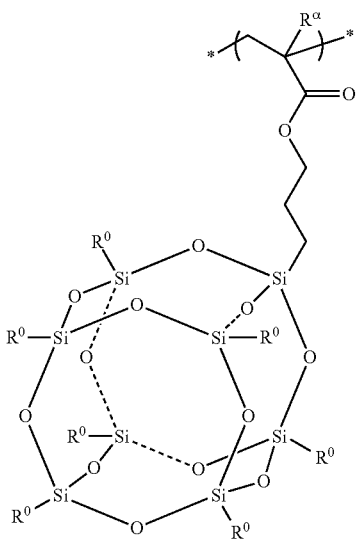

$R^0$ = ethyl group or isobutyl group

In the block copolymer, the number of types of blocks of the structural unit (a0) may be one type or two or more types.

In the block copolymer, the proportion of the structural unit (a0), relative to the total of all the structural units that constitute the block copolymer, is preferably from 1 to 90 mol %, more preferably from 1 to 85 mol %, and still more preferably from 2 to 80 mol %.

By ensuring that the proportion of the structural unit (a0) is at least as large as the preferred lower limit, phase separation is able to occur more readily. On the other hand, by ensuring that the proportion is not more than the preferred upper limit, a good balance can be achieved with the other structural unit(s).

When the proportion of the structural unit (a0) relative to the total of all the structural units that constitute the block copolymer is preferably from 2 to 30 mol %, a lamellar phase-separated structure arranged in the perpendicular direction relative to the surface of the substrate can be obtained more readily, when the proportion is preferably from 5 to 40 mol %, a cylinder-shaped phase-separated structure arranged in the perpendicular direction relative to the surface of the substrate can be obtained more readily, and when the proportion is preferably from 30 to 80 mol %, a dot-like phase-separated structure (a phase-separated structure in which the arrangement of each phase is the reverse of a cylinder-like structure) arranged perpendicularly to the surface of the substrate can be obtained more readily.

—Other Structural Units

The block copolymer used in step (1) preferably contains one or more types of blocks other than the block of the structural unit (a0).

Examples of the block other than the block of the structural unit (a0) include blocks of a structural unit derived from a styrene or derivative thereof, blocks of a structural unit derived from an (α-substituted) acrylic acid, blocks of a structural unit derived from an (α-substituted) acrylate ester, blocks of a structural unit derived from a siloxane or derivative thereof, and blocks of a structural unit derived from an alkylene oxide.

Examples of the styrene or derivative thereof include α-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, 4-vinylbenzyl chloride, 1-vinylnaphthalene, 4-vinylbiphenyl, 1-vinyl-2-pyrrolidone, 9-vinylanthracene and vinylpyridine.

The term "(α-substituted) acrylic acid" refers to one or both of acrylic acid and a compound in which the hydrogen atom bonded to the carbon atom on the α-position of acrylic acid has been substituted with a substituent. Examples of the substituent include alkyl groups of 1 to 5 carbon atoms.

Specific examples of the (α-substituted) acrylic acid include acrylic acid and methacrylic acid.

The term "(α-substituted) acrylate ester" refers to one or both of the acrylate ester and a compound in which the hydrogen atom bonded to the carbon atom on the α-position of acrylate ester has been substituted with a substituent. Examples of the substituent include alkyl groups of 1 to 5 carbon atoms.

Specific examples of the (α-substituted) acrylate ester include acrylate esters such as methyl acrylate, ethyl acrylate, propyl acrylate, n-butyl acrylate, t-butyl acrylate, cyclohexyl acrylate, octyl acrylate, nonyl acrylate, hydroxyethyl acrylate, hydroxypropyl acrylate, benzyl acrylate, anthracene acrylate, glycidyl acrylate, 3,4-epoxycyclohexylmethane acrylate and propyltrimethoxysilane acrylate; and methacrylate esters such as methyl methacrylate, ethyl methacrylate, propyl methacrylate, n-butyl methacrylate, t-butyl methacrylate, cyclohexyl methacrylate, octyl methacrylate, nonyl methacrylate, hydroxyethyl methacrylate, hydroxypropyl methacrylate, benzyl methacrylate, anthracene methacrylate, glycidyl methacrylate, 3,4-epoxycyclohexylmethane methacrylate and propyltrimethoxysilane methacrylate.

Among these, methyl acrylate, ethyl acrylate, t-butyl acrylate, methyl methacrylate, ethyl methacrylate and t-butyl methacrylate are preferable.

Examples of the siloxane or derivative thereof include dimethylsiloxane, diethylsiloxane, diphenylsiloxane and methylphenylsiloxane.

Examples of the alkylene oxide include ethylene oxide, propylene oxide, isopropylene oxide and butylene oxide.

Among the above possibilities, the block other than the block of the structural unit (a0) is preferably a block of a structural unit derived from an (α-substituted) acrylic acid or a block of a structural unit derived from an (α-substituted) acrylate ester.

In the block copolymer, the proportion of the structural unit(s) other than the structural unit (a0), relative to the total of all the structural units that constitute the block copolymer, is preferably from 10 to 99 mol %, more preferably from 15 to 99 mol %, and still more preferably from 20 to 98 mol %.

When a structural unit derived from an (α-substituted) acrylic acid or an (α-substituted) acrylate ester is used as the structural unit other than the structural unit (a0), the proportion of the (α-substituted) acrylic acid or the (α-substituted) acrylate ester (or if the copolymer includes both, the proportion of the combination thereof), relative to the total of all the structural units that constitute the block copolymer, is preferably from 10 to 99 mol %, more preferably from 15 to 99 mol %, and still more preferably from 20 to 98 mol %.

By ensuring that the proportion of the structural unit(s) other than the structural unit (a0) satisfies the above range, a good balance can be achieved with the structural unit (a0).

The block copolymer used in step (1) has a block of the structural unit (a0), and is preferably a block copolymer having a block of the structural unit (a0) and a block of a structural unit derived from an (α-substituted) acrylic acid, or a block copolymer having a block of the structural unit (a0) and a block of a structural unit derived from an (α-substituted) acrylate ester.

More specific examples of such block copolymers include block copolymers having a block of the structural unit (a0) and a block of acrylic acid, block copolymers having a block of the structural unit (a0) and a block of methyl acrylate, block copolymers having a block of the structural unit (a0) and a block of ethyl acrylate, block copolymers having a block of the structural unit (a0) and a block of t-butyl acrylate, block copolymers having a block of the structural unit (a0) and a block of methacrylic acid, block copolymers having a block of the structural unit (a0) and a block of methyl methacrylate, block copolymers having a block of the structural unit (a0) and a block of ethyl methacrylate, and block copolymers having a block of the structural unit (a0) and a block of t-butyl methacrylate.

In the present aspect, the use of a block copolymer having a block of the structural unit (a0) and a block of methyl methacrylate is particularly preferred.

The weight-average molecular weight (Mw) of the block copolymer (the polystyrene equivalent value determined by gel permeation chromatography) is not particularly limited provided that it is large enough to enable phase separation, and is preferably from 1,000 to 150,000, more preferably from 3,000 to 100,000, and still more preferably from 5,000 to 80,000.

The polydispersity index (Mw/Mn) of the block copolymer is preferably from 1.0 to 3.0, more preferably from 1.0 to 1.5, and still more preferably from 1.0 to 1.2. Mn represents the number-average molecular weight.

The period of the block copolymer (the length of one molecule of the block copolymer) is preferably from 5 to 120 nm, more preferably from 5 to 100 nm, and still more preferably from 10 to 80 nm.

—Organic Solvent

The organic solvent used in the block copolymer solution may be any organic solvent capable of dissolving the block copolymer to form a uniform solution, and examples include lactones such as γ-butyrolactone; ketones such as acetone, methyl ethyl ketone, cyclohexanone, methyl-n-pentyl ketone, methyl isopentyl ketone and 2-heptanone; polyhydric alcohols such as ethylene glycol, diethylene glycol, propylene glycol and dipropylene glycol; polyhydric alcohol derivatives including compounds having an ester bond, such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these polyhydric alcohol derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These organic solvents may be used individually, or as a mixed solvent containing two or more solvents.

Among these possibilities, PGMEA, PGME, cyclohexanone and EL are preferable.

Further, a mixed solvent obtained by mixing PGMEA with a polar solvent is also preferable. The mixing ratio (weight ratio) of the mixed solvent can be determined as appropriate, with due consideration of the compatibility of the PGMEA and the polar solvent, but is preferably within a range from 1:9 to 9:1, and more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3. Alternatively, when PGME and cyclohexanone are mixed as polar solvents, the PGMEA: (PGME+cyclohexanone) weight ratio is preferably from 1:9 to 9:1, more preferably from 2:8 to 8:2, and still more preferably 3:7 to 7:3.

Further, as the organic solvent for the block copolymer solution, a mixed solvent of PGMEA, EL, or an aforementioned mixed solvent of PGMEA and a polar solvent, with γ-butyrolactone is also preferable. In this case, the mixing ratio (former:latter) of the mixed solvent is preferably from 70:30 to 95:5.

If desired, other miscible additives besides the aforementioned block copolymer and organic solvent can also be added to the block copolymer solution. For example, appropriate amounts of additive resins for improving the performance of the pattern composed of the neutralization film described below, surfactants for improving the applicability to the substrate, dissolution inhibitors, plasticizers, stabilizers, colorants, halation prevention agents, dyes, sensitizers, base-generating agents and basic compounds may be added as required.

(Substrate)

There are no particular limitations on the substrate, provided that the block copolymer solution can be applied to the surface of the substrate.

Specific examples of the substrate include substrates formed from metals such as silicon, copper, chromium, iron and aluminum, substrates formed from inorganic substances such as glass, titanium oxide, silica and mica, and substrates formed from organic compounds such as acrylic sheets, polystyrene, cellulose, cellulose acetate and phenolic resins. An inorganic and/or organic film may be provided on the surface of these substrates. Examples of the inorganic film include inorganic antireflection films (inorganic BARC). Examples of the organic film include organic antireflection films (organic BARC).

Further, the substrate is preferably a substrate that has been subjected to processing which induces self-assembly of the block copolymer on the substrate surface, and a specific example is a substrate prepared by forming a prescribed pattern composed of a neutralization film on a substrate used for electronic componentry.

Formation of the prescribed pattern composed of this neutralization film can be achieved using a method of forming a pattern that includes a neutralization film formation step of forming a neutralization film containing a surface treatment agent on the substrate, a mask pattern formation step of forming a mask pattern composed of a photosensitive resin film on the neutralization film, a transfer step of transferring the mask pattern to the neutralization film, and a removal step of removing the mask pattern following the transfer.

[Neutralization Film Formation Step]

First, a neutralization film containing a surface treatment agent is formed on the substrate (namely, the substrate is subjected to a neutralization treatment).

A "neutralization treatment" is a treatment in which the surface of the substrate is modified so as to have affinity for all the blocks that constitute the block copolymer. By performing a neutralization treatment, it is possible to prevent the situation in which only those phases composed of specific blocks come into contact with the surface of the substrate due to phase separation. For this reason, it is preferable to form a neutralization film on the substrate surface that is appropriate for the type of block copolymer being used, prior to forming the layer containing the block copolymer which is used for forming the phase-separated structure on the substrate surface by phase separation (and preferably a lamellar or cylinder-shaped phase-separated structure arranged in the perpendicular direction relative to the surface of the substrate).

Specifically, a thin film containing a surface treatment agent (the neutralization film) which has affinity with all of the blocks that constitute the block copolymer is formed on the surface of the substrate. The neutralization film can be formed, for example, by applying a surface treatment agent to the substrate.

Further, there are no particular limitations on the size or shape of the substrate used in the present aspect. The substrate need not necessarily have a smooth surface, and substrates of various shapes formed from all manner of materials can be selected as appropriate. For example, substrates having a curved surface, flat substrates having surface unevenness, and even thin flake-shaped substrates can be used.

Before forming the neutralization film on the substrate, the surface of the substrate may be cleaned. By cleaning the substrate surface, the subsequent formation of the neutralization film can be performed more satisfactorily.

A conventional method may be used as the cleaning method, and examples include an oxygen plasma treatment, a hydrogen plasma treatment, an ozone oxidation treatment, an acid alkali treatment, and a chemical modification treatment. For example, in one method the substrate is immersed in an acidic solution such as a sulfuric acid/hydrogen peroxide aqueous solution, and is then washed with water and dried.

The neutralization film can be formed by using a resin composition as the surface treatment agent.

This resin composition may be selected appropriately from among conventional resin compositions used for forming thin films, in accordance with the types of blocks that constitute the block copolymer.

The resin composition used as the surface treatment agent may be a heat-polymerizable resin composition, or a photosensitive resin composition such as a positive resist composition or a negative resist composition. Alternatively, a compound may be used as the surface treatment agent, and a non-polymerizable film formed by applying this compound may be used as the neutralization film. For example, a siloxane-based organic monomolecular film formed from a surface treatment agent such as phenethyltrichlorosilane, octadecyltrichlorosilane or hexamethyldisilazane may also be used favorably as the neutralization film.

Examples of this type of surface treatment agent include a resin composition containing a resin having all the structural units of the blocks that constitute the block copolymer, a resin composition containing a resin having structural units which have high affinity for each of the blocks that constitute the block copolymer, and a resin composition containing a resin having a polarity close to the average value of the polarities of all the blocks that constitute the block copolymer.

For example, when a block copolymer having blocks of the structural unit (a0) and methyl methacrylate is used, it is preferable to use, as the surface treatment agent, a resin composition containing a resin having methyl methacrylate as a structural unit, or a compound or composition containing both a portion having high affinity for the POSS structure and a portion having high affinity for methyl methacrylate.

Examples of the portion having high affinity for methyl methacrylate include monomers having functional groups of high polarity such as a trimethoxysilyl group, trichlorosilyl group, carboxyl group, hydroxyl group, cyano group, or hydroxyalkyl group in which a portion of the hydrogen atoms of an alkyl group have each been substituted with a hydroxyl group.

[Mask Pattern Formation Step]

Next, a mask pattern composed of a photosensitive resin film is formed on the neutralization film. A pattern produced by transferring this mask pattern to the neutralization film functions as a guide pattern.

Formation of the mask pattern on the neutralization film can be performed, for example, in the manner described below.

First, a photosensitive resin composition is applied to the neutralization film using a spinner or the like, and a bake treatment (post applied bake (PAB)) is conducted under temperature conditions of 80 to 150° C., preferably for 40 to 120 seconds, and more preferably 60 to 90 seconds, thus forming a photosensitive resin film.

Next, an exposure apparatus such as an ArF exposure apparatus, electron beam lithography apparatus or EUV exposure apparatus or the like is used to perform selective exposure, either by exposing the photosensitive resin film through a mask having a predetermined pattern formed therein (namely, a mask pattern), or by patterning the photosensitive resin film via direct irradiation with an electron beam without using a mask pattern, and the resin film is then subjected to a bake treatment (post exposure bake (PEB)) under temperature conditions of 80 to 150° C., preferably for 40 to 120 seconds, and more preferably 60 to 90 seconds.

Subsequently, the selectively exposed photosensitive resin film is subjected to a developing treatment.

The developing treatment is performed using an alkali developing solution in the case of an alkali developing process, or using a developing solution containing an organic solvent (an organic developing solution) in the case of a solvent developing process.

A rinse treatment is preferably performed following the developing treatment. In the case of an alkali developing process, the rinse treatment is preferably performed using pure water, whereas in the case of a solvent developing process, the rinse treatment is preferably performed using a rinse liquid containing an organic solvent.

In the case of a solvent developing process, residual developing solution or rinse liquid adhered to the pattern following the developing treatment or rinse treatment may be removed by treatment using a supercritical fluid.

Drying is performed following the developing treatment or the rinse treatment. Further, in some cases, a bake treatment (post bake) may be performed following the developing treatment.

In this manner, a mask pattern can be obtained.

The wavelength used for the exposure is not particularly limited, and the exposure can be conducted using various forms of radiation, including ArF excimer laser, KrF excimer laser, $F_2$ excimer laser, extreme ultraviolet rays (EUV), vacuum ultraviolet rays (VUV), electron beam (EB), X-rays, and soft X-rays.

The exposure method used for the photosensitive resin film may employ either general exposure (dry exposure) conducted in air or an inert gas such as nitrogen, or liquid immersion lithography.

In liquid immersion lithography, the region between the photosensitive resin film and the lens at the lowermost point of the exposure apparatus is pre-filled with a solvent (liquid immersion medium) that has a larger refractive index than the refractive index of air, and the exposure (immersion exposure) is conducted in this state.

The liquid immersion medium is preferably a solvent having a refractive index larger than the refractive index of air but smaller than the refractive index of the photosensitive resin film to be exposed. The refractive index of the solvent is not particularly limited as long as it satisfies the above requirements.

Examples of solvents having a refractive index that is larger than the refractive index of air but smaller than the refractive index of the photosensitive resin film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, wherein the boiling point is preferably within a range from 70 to 180° C., and more preferably from 80 to 160° C. A fluorine-based inert liquid having a boiling point within the above range is advantageous in that the removal of the solvent used in the liquid immersion after completion of the exposure can be conducted by a simple method.

As the fluorine-based inert liquid, a perfluoroalkyl compound in which all of the hydrogen atoms of an alkyl group have been substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and one example of a suitable perfluoroalkylamine compound is perfluorotributylamine (boiling point: 174° C.).

As the liquid immersion medium, water is preferable in terms of cost, safety, environmental issues and versatility.

Examples of the alkali developing solution used for the developing treatment in an alkali developing process include 0.1 to 10% by weight aqueous solutions of tetramethylammonium hydroxide (TMAH).

The organic solvent within the organic developing solution that is used for the developing treatment in a solvent developing process may be selected appropriately from among any of the conventional solvents capable of dissolving the photosensitive resin prior to exposure. Specific examples of organic solvents that may be used include polar solvents such as ketone-based solvents, ester-based solvents, alcohol-based solvents, amide-based solvents and ether-based solvents, and hydrocarbon-based solvents.

If required, known additives can be added to the organic developing solution. Examples of these additives include surfactants. There are no particular limitations on the surfactants, and ionic and nonionic fluorine-based surfactants and/or silicon-based surfactants can be used.

In those cases where a surfactant is added, the amount of the surfactant is typically within a range from 0.001 to 5% by weight, more preferably from 0.005 to 2% by weight, and still more preferably from 0.01 to 0.5% by weight, relative to the total weight of the organic developing solution.

The developing treatment can be implemented using a conventional developing method, such as a method in which the substrate is dipped in the developing solution for a predetermined period of time (dipping method), a method in which the developing solution is placed and held stationary on the surface of the substrate by surface tension for a predetermined period of time (puddle method), a method in which the developing solution is sprayed onto the substrate surface (spray method), and a method in which the substrate is spun at a constant rate, and a developing solution discharge nozzle is then scanned across the substrate at a constant rate while the developing solution is discharged continuously from the nozzle (dynamic dispensing method).

The rinse treatment (washing treatment) using a rinse liquid may be performed using a conventional rinse method. Examples of the rinse method include a method in which the rinse liquid is discharged continuously onto the substrate while the substrate is spun at a constant rate (spin coating method), a method in which the substrate is dipped in the rinse liquid for a predetermined period of time (dipping method) and a method in which the rinse liquid is sprayed onto the substrate surface (spray method).

The photosensitive resin composition used in forming the mask pattern can use a composition selected appropriately from among resist compositions typically used in forming resist patterns, and modified compositions thereof.

Examples of such resist compositions include photosensitive resin compositions which generate an acid upon exposure, and undergo a change in solubility in the developing solution under the action of acid, and either a positive resist composition in which the exposed portions are dissolved and removed to form a positive pattern, or a negative resist composition in which the unexposed portions are dissolved and removed to form a negative pattern may be used. Further, the resist composition may be a composition designed for use in an alkali developing process which uses an alkali developing solution for the developing treatment at the time of resist pattern formation, or a composition designed for use in a solvent developing process which uses an organic developing solution in the developing treatment.

Further, the mask pattern may also be formed using a typical dry etching treatment or wet etching treatment.

[Transfer Step]

Subsequently, the mask pattern is transferred to the neutralization film. The transfer method may be any method which destroys the neutral state of those regions of the neutralization film not covered by the mask pattern. For example, by selectively removing only those regions of the neutralization film not covered with the mask pattern, the mask pattern can be transferred to the neutralization film. The method used for selectively removing only those regions of the neutralization film not covered with the mask pattern can be selected appropriately from conventional methods used in pattern formation, with due consideration of the type of composition that constitutes the neutralization film and the type of resin that constitutes the mask pattern. For example, those regions of the neutralization film that are exposed can be selectively removed in preference to the regions covered by the mask pattern by a dry etching treatment such as an oxygen plasma treatment or a hydrogen plasma treatment. Further, when the neutralization film is a film formed from a positive resist composition, the mask pattern can be transferred to the neutralization film by irradiating light of a suitable wavelength onto the neutralization film, thereby selectively exposing only those regions not covered by the mask pattern, and subsequently performing a developing treatment to remove the exposed portions. Alternatively, the mask pattern can be transferred to the neutralization film by subjecting the substrate surface having the mask pattern formed on the neutralization film to an acid treatment or alkali treatment, or by adsorbing a self-assembled monolayer (SAM) having no neutralization function to the exposed portions of the neutralization film surface. The acid or alkali used in the acid treatment or alkali treatment may be any compound provided it does not strip the mask pattern from the surface of the neutralization film, and for example, dilute sulfuric acid or tetramethylammonium hydroxide (TMAH) or the like can be used. Further, examples of compounds that can be used as the aforementioned SAM include hexamethyldisilazane.

[Removal Step]

Following transfer of the mask pattern to the neutralization film, the mask pattern is removed from the substrate. As a result of removing the mask pattern, a flat guide pattern, which has been formed by processing the neutralization film containing the surface treatment agent into a pattern having the same shape as the guide pattern, is formed on the substrate surface.

There are no particular limitations on the method of removing the mask pattern, provided the method has substantially no effect on the neutralization film and is able to remove only the photosensitive resin film in which the mask pattern is formed, and the method may be selected appropriately from conventional methods used in pattern formation with due consideration of factors such as the type of composition that constitutes the neutralization film and the type of resin that constitutes the mask pattern. For example, by washing the substrate surface using an organic solvent or the like which exhibits poor dissolution of the composition that constitutes the neutralization film but excellent dissolution of the photosensitive resin composition that constitutes the mask pattern, the mask pattern can be selectively dissolved and removed. Alternatively, the mask pattern covering the neutralization film can be selectively removed by a dry etching treatment such as an oxygen plasma treatment or a hydrogen plasma treatment.

<Step (2)>

In step (2), a top coat film is formed by applying, to the layer containing the block copolymer, a top coat material which undergoes a change in polarity upon heating and controls the surface energy of the layer containing the block copolymer.

By using this top coat material to provide a top coat film on the layer containing the block copolymer, the surface state of the layer can be controlled favorably, and phase separation can be achieved in a more stable manner.

In the present embodiment, formation of the top coat film 3 can be performed, for example, by using a spinner or the like to apply the aforementioned top coat material to the layer 2 containing the block copolymer. Following this application, a bake treatment may be performed. In the bake treatment, the heating temperature is preferably from 80 to 280° C., and the heating time is preferably from 10 to 600 seconds.

The thickness of the top coat film 3 formed on the layer 2 is preferably from 2 to 500 nm, more preferably from 5 to 200 nm, and still more preferably from 10 to 100 nm. By ensuring that the thickness of the top coat film 3 satisfies the preferred range described above, any effects of the external environment can be adequately blocked, enabling the phase separation to occur more readily.

The top coat material according to the third aspect of the present invention described below, or the top coat material according to the fourth aspect of the present invention can be used as the top coat material.

<Step (3)>

In step (3), the layer containing the block copolymer with the top coat film formed thereon is subjected to phase separation by thermal annealing.

In the present embodiment, thermal annealing means heating the substrate 1 having the layer 2 containing the block copolymer formed thereon. The heating temperature is preferably at least as high as high as the glass transition temperature of the block copolymer being used, but less than the thermal decomposition temperature. In the present aspect, the heating temperature is preferably from 100 to 300° C., and more preferably from 120 to 280° C. The heating time is preferably from 0.5 to 1,440 minutes, and more preferably from 1 to 600 minutes. Further, the heating is preferably performed within a low reactivity gas such as nitrogen.

By performing thermal annealing of the layer 2 containing the block copolymer in this manner, the layer 2 containing the block copolymer undergoes phase separation. As a result, a structure 4 having a phase-separated structure (and preferably a lamellar or cylinder-shaped phase-separated structure arranged in the perpendicular direction relative to the surface of the substrate) is produced on the surface of the substrate 1. In addition, in the present embodiment, self-assembly of the block copolymer proceeds with a shorter annealing treatment than that required for solvent annealing.

<<Method of Forming Pattern>>

The second aspect of the present invention is a method of forming a pattern, the method including a step (4) of forming a pattern by selectively removing a phase composed of at least one type of block from the structure containing a phase-separated structure produced using the method of the first aspect.

The method of forming a pattern according to this aspect is described below with reference to the drawings. However, the present invention is not limited to the following description.

Figure 2:
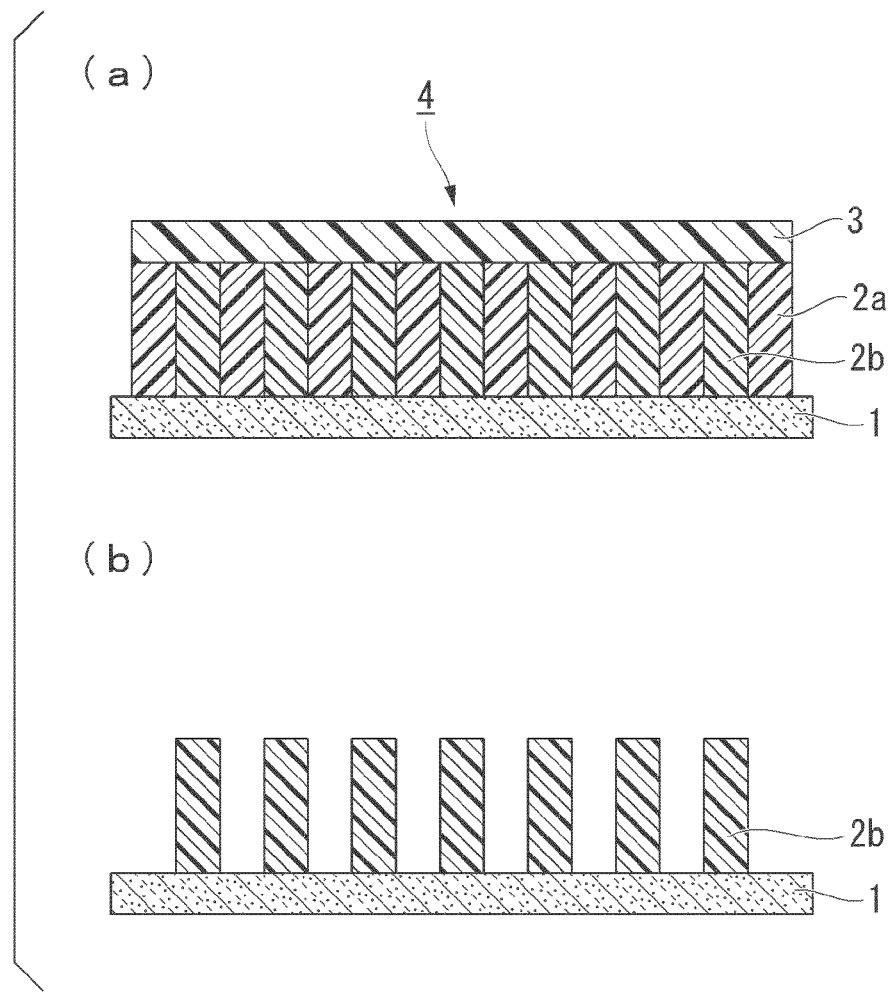
FIG. 2 is a schematic process diagram describing one embodiment of the method of forming a pattern according to the present invention.

FIG. 2 illustrates one embodiment of the method of forming a pattern according to the present aspect.

In this embodiment, a phase composed of a $P_B$ block is selectively removed from the structure containing the phase-separated structure.

First, the structure 4 having a phase-separated structure is prepared on the surface of a substrate 1 (FIG. 2(a): the same as FIG. 1(d)).

Subsequently, an etching method is used to selectively remove the top coat film 3 and a phase 2a composed of a $P_B$ block from the structure 4. This forms a pattern on the substrate 1 (FIG. 2(b), step (4)).

<Step (4)>

In step (4), a pattern is formed by selectively removing a phase composed of at least one type of block from the structure containing a phase-separated structure produced using the production method according to the first aspect of the present invention. This enables formation of a pattern of minute dimensions (a nano-size structure).

In the following description, among the blocks that constitute the block copolymer, a block which is not selectively removed is referred to as a "$P_A$ block", and a block which is to be selectively removed is referred to as a "$P_B$ block".

In the present embodiment, the phase 2a composed of the $P_B$ block is selectively removed from the phase-separated structure of the block copolymer on the surface of the substrate 1. As a result, only a phase 2b composed of the $P_A$ block remains on the substrate 1. In other words, a pattern composed of only the $P_A$ block is formed on the substrate 1.

There are no particular limitations on the selective removal treatment of the phase 2a composed of the $P_B$ block, provided the treatment is able to decompose and remove the $P_B$ block without affecting the $P_A$ block, and either a dry etching method or a solution etching method may be used.

A dry etching method is a method in which a reactive dry gas is blown onto the phase-separated structure, with the selective removal achieved on the basis of a difference in the decomposition rates of the repeating units of the different blocks relative to the dry gas. Specific examples include an oxygen plasma treatment, a hydrogen plasma treatment and an ozone treatment.

A solution etching method is a method in which the phase-separated structure is immersed in a developing solution containing an organic solvent as the main component to preferentially dissolve and remove a specific phase, if necessary after the repeating structure of a specific block region within the phase-separated structure has been selectively decomposed. In the case of a solution etching method, before the structure is immersed in the developing solution but following formation of the phase-separated structure, the layer containing the block copolymer on the substrate is treated so as to decompose (reduce the molecular weight of) at least a portion of the repeating structure within the phase composed of the $P_B$ block. By decomposing a portion of the $P_B$ block in advance, the solubility of the block within the developing solution can be enhanced, and as a result, the phase composed of the $P_B$ block can be selectively removed more easily from the phase composed of the $P_A$ block.

The shape and size of the phase that is to be selectively removed from the phase-separated structure (namely, the phase 2a composed of the $P_B$ block) is dependent on the compositional ratio of the respective blocks that constitute the block copolymer, and the molecular weight of the block copolymer. For example, by making the compositional ratio by volume of the $P_B$ block within the block copolymer comparatively small, a phase-separated structure can be formed in which the phase 2a composed of the $P_B$ block exists in a cylindrical form within the phase 2b composed of the $P_A$ block. On the other hand, by making the compositional ratio by volume of the $P_B$ block within the block copolymer approximately the same as that of the $P_A$ block, a lamellar phase-separated structure can be formed in which the phase 2b composed of the $P_A$ block and the phase 2a composed of the $P_B$ block are laminated in an alternating manner. Further, by increasing the molecular weight of the block copolymer, the size of each phase can be increased.

The selective removal treatment of the phase 2a composed of the $P_B$ block is not limited to a dry etching method or solution etching method, and any treatment that enables preferential decomposition of the $P_B$ block over the $P_A$ block can be selected appropriately, in accordance with the varieties of the $P_A$ block and the $P_B$ block, from methods typically used for polymer decomposition. Examples of such methods include ultraviolet (UV) irradiation treatments, thermal decomposition treatments and chemical reaction treatments.

Further, in the present embodiment, the operation for selective removal of the phase 2a from the structure 4 is performed without removing the top coat film 3, but the invention is not limited to this particular method, and the selective removal operation may be performed following removal of the top coat film 3. Performing the operation for selective removal of the phase composed of the specified block following removal of the top coat film is preferable in terms of enabling more uniform removal of the top coat film.

Removal of the top coat film can be performed as appropriate in accordance with the variety of top coat film.

Removal of the top coat film can be implemented by a method that involves applying a solvent for the top coat material to the top coat film. Examples of this solvent for the top coat material include the same solvents as those mentioned below as the solvent for the top coat material of the third aspect of the present invention or the top coat material of the fourth aspect of the present invention.

The substrate produced in this manner, having a pattern formed from only the $P_A$ block on the substrate surface, can be used without further modification as a semiconductor element or the like.

<<Top Coat Material>>

The third aspect of the present invention is a top coat material (hereafter also referred to as "the top coat material (1)") that can be used in the aforementioned production method according to the first aspect of the present invention, the top coat material containing a polymeric compound having a structural unit (Tc1) which undergoes a change in polarity upon heating, and a surface energy control agent which controls the surface energy of the layer containing the block copolymer.

The fourth aspect of the present invention is a top coat material (hereafter also referred to as "the top coat material (2)") that can be used in the aforementioned production method according to the first aspect of the present invention, the top coat material containing a polymeric compound having a structural unit (Tc1) which undergoes a change in polarity upon heating and a structural unit (Tc2) which controls the surface energy of the layer containing the block copolymer.

<Top Coat Material (1)>

The top coat material (1) contains a polymeric compound having a structural unit (Tc1) which undergoes a change in polarity upon heating, and a surface energy control agent which controls the surface energy of the layer containing the block copolymer.

(Polymeric Compound)

The polymeric compound used in the top coat material (1) has a structural unit (Tc1) which undergoes a change in polarity upon heating.

By including the structural unit (Tc1), the surface energy of the layer containing the block copolymer can be maintained at an appropriate level during phase separation.

The expression "structural unit which undergoes a change in polarity upon heating" describes a repeating unit which undergoes a change in structure upon heating, causing a change in the exposed state of a polar group. Examples include repeating units in which an open ring structure undergoes a dehydration condensation upon heating to form a ring structure, thus causing a change in the exposed state of a polar group.

Examples of the polar group include —COO⁻, —SO₃⁻, —NH₄⁺, a carboxyl group, a hydroxyl group, an amino group, and a sulfo group (—SO₃H).

Examples of the structural unit (Tc1) include structural units represented by chemical formulas shown below.

The structural unit represented by chemical formula (Tc1-1) is a structural unit which, under the presence of a basic component, exhibits increased polarity upon heating. The structural unit represented by chemical formula (Tc1-2) is a structural unit which exhibits reduced polarity upon heating.

[Chemical Formula 4]

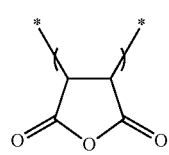

(Tc1-1)

-continued

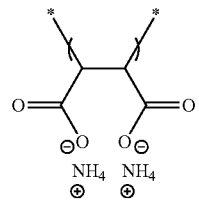

(Tc1-2)

The structural unit (Tc1) within the polymeric compound may be a single type of structural unit or a combination of two or more types.

Whether to select a structural unit which exhibits increased polarity upon heating or a structural unit which exhibits reduced polarity upon heating as the structural unit (Tc1) can be determined appropriately in accordance with factors such as the type of block copolymer, and the size of the surface energy of the layer containing the block copolymer.

Among the various possibilities for the structural unit (Tc1), the use of a structural unit represented by the above chemical formula (Tc1-1) or a structural unit represented by chemical formula (Tc1-2) is preferable.

The proportion of the structural unit (Tc1) within the polymeric compound, relative to the total of all the structural units that constitute the polymeric compound, is preferably from 10 to 90 mol %, more preferably from 30 to 80 mol %, and still more preferably from 40 to 80 mol %.

By ensuring that the proportion of the structural unit (Tc1) satisfies the above preferred range, the surface energy of the layer containing the block copolymer can be more easily maintained at an appropriate level during phase separation.

The polymeric compound used in the top coat material (1) may have one or more structural units other than the structural unit (Tc1).

Examples of these structural units other than the structural unit (Tc1) include an aforementioned structural unit (Tc2) which controls the surface energy of the layer containing the block copolymer, and a structural unit (Tc3) which alters the glass transition temperature (Tg).

—Structural Unit (Tc2)

The structural unit (Tc2) is the same as the structural unit (Tc2) described below in the section entitled <Top Coat Material (2)>.

The structural unit (Tc2) within the polymeric compound may be a single type of structural unit or a combination of two or more types.

Among the various possibilities for the structural unit (Tc2), the use of at least one structural unit selected from the group consisting of structural units represented by general formula (Tc2-1) shown below, structural units represented by general formula (Tc2-2) shown below and structural units represented by general formula (Tc2-3) shown below is preferable, and the use of at least one structural unit selected from the group consisting of structural units represented by general formula (Tc2-1) and structural units represented by general formula (Tc2-2) is particularly preferable.

When the polymeric compound includes the structural unit (Tc2), the proportion of the structural unit (Tc2) within the polymeric compound, relative to the total of all the structural units that constitute the polymeric compound, is preferably from 10 to 90 mol %, more preferably from 20 to 70 mol %, and still more preferably from 20 to 60 mol %.

By ensuring that the proportion of the structural unit (Tc2) satisfies the above preferred range, the surface energy of the layer containing the block copolymer can be more easily controlled.

In the top coat material (1), either a single type of the polymeric compound having the structural unit (Tc1) may be used alone, or a combination of two or more types of the polymeric compound may be used.

The polymeric compound used in the top coat material (1) is a polymer containing at least the structural unit (Tc1), and is preferably a copolymer containing the structural unit (Tc2) in addition to the structural unit (Tc1).

Among such copolymers, examples of particularly preferred copolymers include copolymers having a repeating structure composed of a structural unit represented by chemical formula (Tc1-1) shown above, a structural unit represented by general formula (Tc2-1) shown below, and a structural unit represented by general formula (Tc2-2) shown below.

Specific examples of favorable polymeric compounds for use in the top coat material (1) include the same polymeric compounds as those specifically mentioned below within the following description entitled <Top Coat Material (2)>.

The weight-average molecular weight (Mw) (the polystyrene equivalent value determined by gel permeation chromatography (GPC)) of the polymeric compound used in the top coat material (1) is not particularly limited, but is preferably from 1,000 to 50,000, more preferably from 1,500 to 30,000, and most preferably from 2,000 to 30,000. Ensuring that the weight-average molecular weight satisfies the above preferred range improves the solubility of the polymeric compound in solvents.

The molecular weight dispersity index (Mw/Mn) of the polymeric compound is preferably from 1.0 to 6.0, more preferably from 1.0 to 5.0, and most preferably from 1.0 to 4.0.

The polymeric compound can be produced, for example, by polymerizing the monomers that give rise to each of the structural units by a conventional radical polymerization or the like using a radical polymerization initiator such as azobisisobutyronitrile (AIBN) or dimethyl azobisisobutyrate.

The amount of the polymeric compound within the top coat material (1) may be altered in accordance with the thickness of the top coat film that is to be formed. The concentration of the polymeric compound within the top coat material (1) is preferably from 0.1 to 15% by weight, and more preferably from 0.2 to 7% by weight.

(Surface Energy Control Agent)

In addition to the polymeric compound having the aforementioned structural unit (Tc1), the top coat material (1) also contains a surface energy control agent which controls the surface energy of the layer containing the block copolymer mentioned above in the section entitled <<Method of Producing Structure Containing Phase-Separated Structure>>.

By including this surface energy control agent, the surface energy of the layer containing the block copolymer can be controlled at an appropriate level during phase separation.

Examples of the surface energy control agent include components (crosslinking agents) which, upon heating, form chemical bonds either between separate molecules of the polymeric compound within the top coat material or within individual polymeric compound molecules.

Specific examples of the surface energy control agent include crosslinking agents such as diamines and triamines, and among the various possibilities, the use of a diamine or a triamine is preferable, and the use of a diamine is particularly desirable.

Specific examples of preferred surface energy control agents include the compounds shown below.

[Chemical Formula 5]

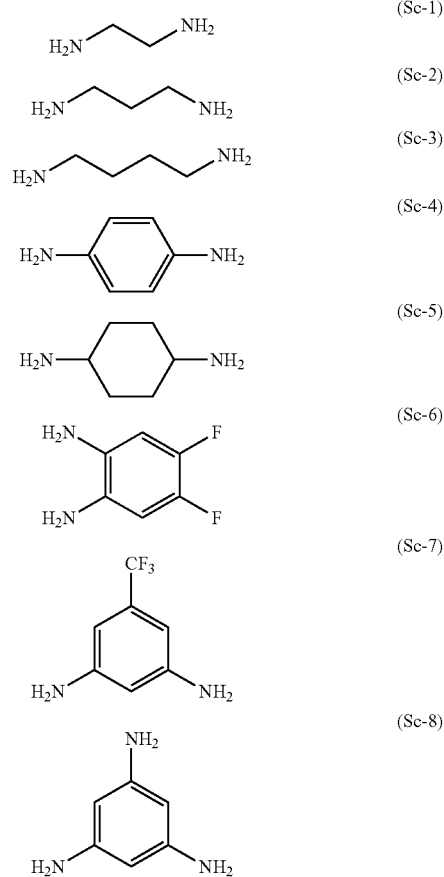

In the top coat material (1), a single surface energy control agent may be used alone, or a combination of two or more types of surface energy control agents may be used.

In the top coat material (1), the amount of the surface energy control agent is preferably from 2 to 500 parts by weight, and more preferably from 5 to 300 parts by weight, per 100 parts by weight of the aforementioned polymeric compound.

Provided the amount of the surface energy control agent is at least as large as the preferred lower limit, the surface energy of the layer containing the block copolymer can be controlled with ease. On the other hand, provided the amount is not more than the preferred upper limit, the film formability improves.

(Optional Components)

If desired, the top coat material (1) may also include other miscible additives and the like in addition to the aforementioned polymeric compound and the surface energy control agent.

—Solvent

The top coat material (1) can be produced by dissolving the polymeric compound and the surface energy control agent described above in a solvent.

This solvent may be any solvent capable of dissolving the components used to form a uniform solution, and specific examples include water, ammonia water (preferably 10 to 50% by weight), methanol, mixed solvents of ammonia water and methanol, mixed solvents of water and methanol, and mixed solvents of ammonia water and ethanol.

<Top Coat Material (2)>

The top coat material (2) contains a polymeric compound having a structural unit (Tc1) which undergoes a change in polarity upon heating and a structural unit (Tc2) which controls the surface energy of the layer containing the block copolymer.

(Polymeric Compound)

The polymeric compound used in the top coat material (2) has a structural unit (Tc1) which undergoes a change in polarity upon heating, and a structural unit (Tc2) which controls the surface energy of the layer containing the block copolymer.

—Structural Unit (Tc1)

The structural unit (Tc1) is the same as the structural unit (Tc1) described above in the section entitled <Top Coat Material (1)>.

The structural unit (Tc1) within the polymeric compound may be a single type of structural unit or a combination of two or more types.

Whether to select a structural unit which exhibits increased polarity upon heating or a structural unit which exhibits reduced polarity upon heating as the structural unit (Tc1) can be determined appropriately in accordance with factors such as the type of block copolymer, and the size of the surface energy of the layer containing the block copolymer.

Among the various possibilities for the structural unit (Tc1), the use of a structural unit represented by the above chemical formula (Tc1-1) or a structural unit represented by chemical formula (Tc1-2) is preferable.

The proportion of the structural unit (Tc1) within the polymeric compound, relative to the total of all the structural units that constitute the polymeric compound, is preferably from 10 to 90 mol %, more preferably from 30 to 80 mol %, and still more preferably from 40 to 80 mol %.

By ensuring that the proportion of the structural unit (Tc1) satisfies the above preferred range, the surface energy of the layer containing the block copolymer can be more easily maintained at an appropriate level during phase separation.

—Structural Unit (Tc2)

The structural unit (Tc2) is a structural unit which controls the surface energy of the layer containing the block copolymer.

By including the structural unit (Tc2), the surface energy of the layer containing the block copolymer can be controlled at an appropriate level during phase separation.

The structural unit (Tc2) may be any unit capable of altering the polarity of the polymeric compound containing the aforementioned structural unit (Tc1), but is preferably at least one structural unit selected from the group consisting of structural units represented by general formula (Tc2-1) shown below, structural units represented by general formula (Tc2-2) shown below, and structural units represented by general formula (Tc2-3) shown below.

[Chemical Formula 6]

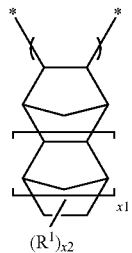

(Tc2-1)

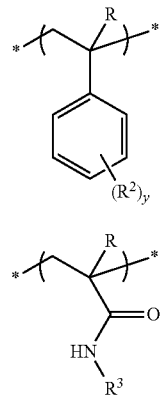

(Tc2-2)

(Tc2-3)

In the formulas, x1 represents 0 or 1, $R^1$ represents a fluorine atom, or a hydrocarbon group which may contain a fluorine atom or an oxygen atom, x2 is an integer of 0 to 4, R represents a hydrogen atom, an alkyl group of 1 to 5 carbon atoms or a halogenated alkyl group of 1 to 5 carbon atoms, the plurality of R groups may be the same or different, $R^2$ represents a fluorine atom, or a hydrocarbon group which may contain a fluorine atom or an oxygen atom, y is an integer of 0 to 3, and $R^3$ represents a hydrocarbon group which may have a substituent, wherein the substituent in $R^3$ is a fluorine atom, or a hydrocarbon group which may contain a fluorine atom or an oxygen atom.

In the formula (Tc2-1), x1 represents 0 or 1.

Moreover, x2 represents an integer of 0 to 4, and is preferably an integer of 0 to 2, more preferably 0 or 1, and most preferably 1.

In formula (Tc2-1), $R^1$ represents a fluorine atom, or a hydrocarbon group which may contain a fluorine atom or an oxygen atom. The hydrocarbon group for $R^1$ may be an aliphatic hydrocarbon group or an aromatic hydrocarbon group, but is preferably an aliphatic hydrocarbon group, and more preferably a monovalent aliphatic saturated hydrocarbon group (alkyl group).

More specific examples of this alkyl group include chain-like aliphatic hydrocarbon groups (linear or branched alkyl groups), and aliphatic hydrocarbon groups that include a ring within the structure.

The linear alkyl group preferably contains 1 to 8 carbon atoms, more preferably 1 to 5 carbon atoms, and still more preferably 1 to 3 carbon atoms. Specific examples include a methyl group, ethyl group, n-propyl group, n-butyl group and n-pentyl group. Among these, a methyl group, ethyl group or n-propyl group is preferable, and a methyl group or ethyl group is particularly desirable.

The branched alkyl group preferably contains 3 to 10 carbon atoms, more preferably 3 to 8 carbon atoms, and still more preferably 3 to 6 carbon atoms.

Examples of the aliphatic hydrocarbon group that includes a ring within the structure include cyclic aliphatic hydrocarbon groups (groups in which one hydrogen atom has been removed from an aliphatic hydrocarbon ring), groups in which such a cyclic aliphatic hydrocarbon group is bonded to the terminal of an aforementioned chain-like aliphatic hydrocarbon group, and groups in which a cyclic aliphatic hydrocarbon group is interposed within the chain of an aforementioned chain-like aliphatic hydrocarbon group.

The cyclic aliphatic hydrocarbon group preferably contains 3 to 8 carbon atoms, and more preferably 4 to 6 carbon atoms, and may be either a polycyclic group or a monocyclic group. The monocyclic group is preferably a group in which one or more hydrogen atoms have been removed from a monocycloalkane of 3 to 6 carbon atoms, and examples of the monocycloalkane include cyclopentane and cyclohexane. The polycyclic group is preferably a group in which one or more hydrogen atoms have been removed from a polycycloalkane of 7 to 12 carbon atoms, and specific examples of the polycycloalkane include adamantane, norbornane, isobornane, tricyclodecane and tetracyclododecane.

The chain-like aliphatic hydrocarbon group or the cyclic aliphatic hydrocarbon group may include a fluorine atom or an oxygen atom. In other words, a hydrogen atom of the aliphatic hydrocarbon group may be substituted with a fluorine atom. Further, a methylene group (—CH$_2$—) of the aliphatic hydrocarbon group may be substituted with an oxygen atom (—O—) or a carbonyl group (—C(=O)—).

When the monovalent hydrocarbon group for $R^1$ is an aromatic hydrocarbon group, the aromatic hydrocarbon group is a monovalent hydrocarbon group having at least one aromatic ring.

There are no particular limitations on this aromatic ring, provided it is a cyclic conjugated system having $4n+2\pi$ electrons, and the aromatic ring may be either monocyclic or polycyclic. The aromatic ring preferably contains 5 to 30 carbon atoms, more preferably 5 to 20 carbon atoms, still more preferably 6 to 15 carbon atoms, and particularly preferably 6 to 12 carbon atoms. This number of carbon atoms does not include any carbon atoms within any substituents described below.

Specific examples of the aromatic ring include aromatic hydrocarbon rings such as benzene, naphthalene, anthracene and phenanthrene, and aromatic heterocyclic rings in which a portion of the carbon atoms that constitute one of the above aromatic hydrocarbon rings has been substituted with a hetero atom. Examples of the hetero atom in the aromatic heterocyclic ring include an oxygen atom, a sulfur atom and a nitrogen atom. Specific examples of the aromatic heterocyclic ring include a pyridine ring and a thiophene ring.

Specific examples of the aromatic hydrocarbon group include groups in which one hydrogen atom has been removed from an aforementioned aromatic hydrocarbon ring or aromatic heterocyclic ring (namely, aryl groups or heteroaryl groups), groups in which one hydrogen atom has been removed from an aromatic compound having two or more aromatic rings (such as biphenyl or fluorene), and groups in which one of the hydrogen atoms of an aforementioned aromatic hydrocarbon ring or aromatic heterocyclic ring has been substituted with an alkylene group (for example, arylalkyl groups such as a benzyl group, phenethyl group, 1-naphthylmethyl group, 2-naphthylmethyl group, 1-naphthylethyl group or 2-naphthylethyl group).

The alkylene group bonded to the aryl group or heteroaryl group preferably contains 1 to 4 carbon atoms, more preferably 1 or 2 carbon atoms, and most preferably 1 carbon atom.

The aromatic hydrocarbon group may include a fluorine atom or an oxygen atom. In other words, a hydrogen atom of the aromatic hydrocarbon group may be substituted with a fluorine atom. Further, a methylene group (—CH$_2$—) of the aromatic hydrocarbon group may be substituted with an oxygen atom (—O—) or a carbonyl group (—C(=O)—).

In the above formulas (Tc2-2) and (Tc2-3), R represents a hydrogen atom, an alkyl group of 1 to 5 carbon atoms or a halogenated alkyl group of 1 to 5 carbon atoms, and the plurality of R groups may be the same or different.

The alkyl group of 1 to 5 carbon atoms for R is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group. The halogenated alkyl group of 1 to 5 carbon atoms is a group in which part or all of the hydrogen atoms of an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

R is preferably a hydrogen atom, an alkyl group of 1 to 5 carbon atoms or a fluorinated alkyl group of 1 to 5 carbon atoms, and from the viewpoint of ease of industrial availability, is most preferably a hydrogen atom or a methyl group.

In formula (Tc2-2), Examples of $R^2$ include the same groups as those mentioned above for $R^1$ in formula (Tc2-1).

Further, y represents an integer of 0 to 3, and is preferably an integer of 0 to 2, more preferably 1 or 2, and most preferably 1.

In formula (Tc2-3), $R^3$ represents a hydrocarbon group which may be substituted with a substituent.

Examples of the hydrocarbon group for $R^3$ include the same groups as those mentioned above for the hydrocarbon group for $R^1$ in formula (Tc2-1).

The substituent within $R^3$ is a fluorine atom or a hydrocarbon group which may contain a fluorine atom or an oxygen atom, and specific examples include the same substituents as those mentioned above within the description for $R^1$ in formula (Tc2-1).

Specific examples of the structural unit represented by the above formula (Tc2-1) are shown below.

In the formulas, $R^{11}$ represents a hydrogen atom, or a hydrocarbon group which may contain a fluorine atom.

Examples of the hydrocarbon group for include the same groups as those mentioned above for the hydrocarbon group for $R^1$ in formula (Tc2-1).

[Chemical Formula 7]

(Tc2-1-1)

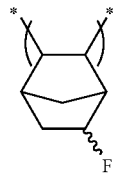

(Tc2-1-2)

(Tc2-1-3)
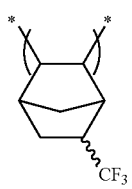

(Tc2-1-4)
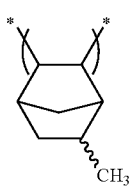

(Tc2-1-5)
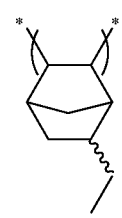

(Tc2-1-6)
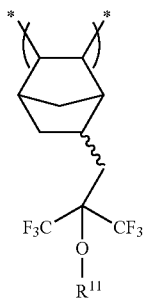

(Tc2-1-7)

(Tc2-1-8)
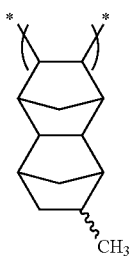

(Tc2-1-9)
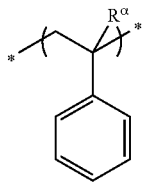

Specific examples of the structural unit represented by the above formula (Tc2-2) are shown below. In each of the following formulas, $R^\alpha$ represents a hydrogen atom, a methyl group or a trifluoromethyl group.

In the formulas, $R^{12}$ represents a hydrogen atom, or a hydrocarbon group which may contain a fluorine atom.

Examples of the hydrocarbon group for $R^{12}$ include the same groups as those mentioned above for the hydrocarbon group for $R^1$ in formula (Tc2-1).

[Chemical Formula 8]

(Tc2-2-1)
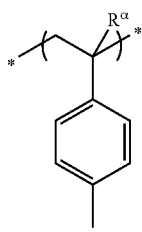

(Tc2-2-2)

(Tc2-2-3)
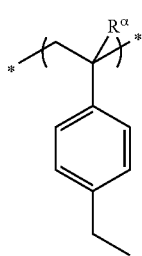

(Tc2-2-4) 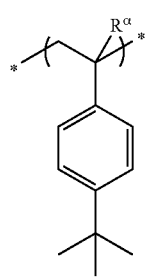

(Tc2-2-5) 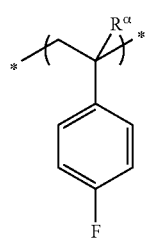

(Tc2-2-6) 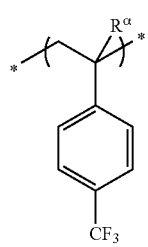

(Tc2-2-7) 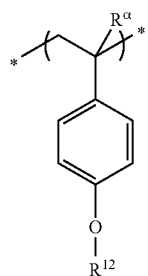

(Tc2-2-8) 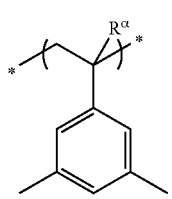

(Tc2-2-9) 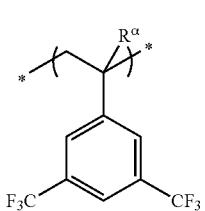

(Tc2-2-10) 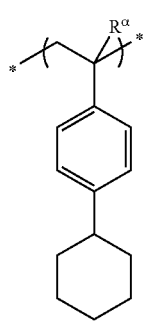

Specific examples of the structural unit represented by the above formula (Tc2-3) are shown below. In each of the following formulas, $R^\alpha$ represents a hydrogen atom, a methyl group or a trifluoromethyl group.

In the formulas, $R^{13}$ represents a hydrogen atom, or a hydrocarbon group which may contain a fluorine atom.

Examples of the hydrocarbon group for $R^{13}$ include the same groups as those mentioned above for the hydrocarbon group for $R^1$ in formula (Tc2-1).

[Chemical Formula 9]

(Tc2-3-1) 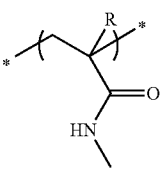

(Tc2-3-2) 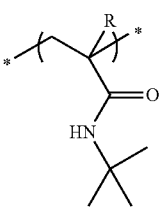

(Tc2-3-3) 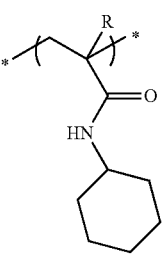

(Tc2-3-4) 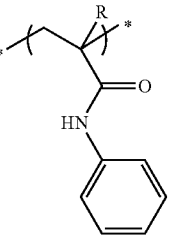

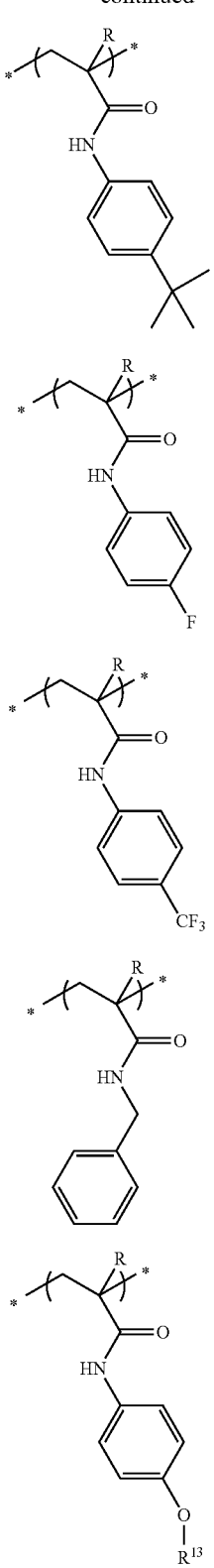

The structural unit (Tc2) within the polymeric compound may be a single type of structural unit or a combination of two or more types.

Among the various possibilities for the structural unit (Tc2), the use of at least one structural unit selected from the group consisting of structural units represented by general formula (Tc2-1), structural units represented by general formula (Tc2-2) and structural units represented by general formula (Tc2-3) is preferable, and the use of at least one structural unit selected from the group consisting of structural units represented by general formula (Tc2-1) and structural units represented by general formula (Tc2-2) is more preferable.

The proportion of the structural unit (Tc2) within the polymeric compound, relative to the total of all the structural units that constitute the polymeric compound, is preferably from 10 to 90 mol %, more preferably from 20 to 70 mol %, and still more preferably from 20 to 60 mol %.

By ensuring that the proportion of the structural unit (Tc2) satisfies the above preferred range, the surface energy of the layer containing the block copolymer can be more easily controlled.

The polymeric compound used in the top coat material (2) may include a structural unit other than the structural unit (Tc1) and the structural unit (Tc2).

An example of a structural unit other than the structural unit (Tc1) and the structural unit (Tc2) is the structural unit (Tc3) which alters the glass transition temperature (Tg).

In the top coat material (2), the polymeric compound having the structural unit (Tc1) and the structural unit (Tc2) may be a single type of compound or a combination of two or more types of compounds.

The polymeric compound used in the top coat material (2) is a copolymer containing at least the structural unit (Tc1) and the structural unit (Tc2).

More specific examples of this copolymer include a copolymer having a repeating structure composed of a structural unit represented by chemical formula (Tc1-2) and a structural unit represented by general formula (Tc2-1), a copolymer having a repeating structure composed of a structural unit represented by chemical formula (Tc1-2) and a structural unit represented by general formula (Tc2-2), a copolymer having a repeating structure composed of a structural unit represented by chemical formula (Tc1-2) and a structural unit represented by general formula (Tc2-3), a copolymer having a repeating structure composed of a structural unit represented by chemical formula (Tc1-2), a structural unit represented by general formula (Tc2-1) and a structural unit represented by general formula (Tc2-2), a copolymer having a repeating structure composed of a structural unit represented by chemical formula (Tc1-2), a structural unit represented by general formula (Tc2-1) and a structural unit represented by general formula (Tc2-3), a copolymer having a repeating structure composed of a structural unit represented by chemical formula (Tc1-2), a structural unit represented by general formula (Tc2-2) and a structural unit represented by general formula (Tc2-3), and a copolymer having a repeating structure composed of a structural unit represented by chemical formula (Tc1-1), a structural unit represented by general formula (Tc2-1) and a structural unit represented by general formula (Tc2-2). Among these, a copolymer having a repeating structure composed of a structural unit represented by chemical formula (Tc1-1), a structural unit represented by general formula (Tc2-1) and a structural unit represented by general formula (Tc2-2) is particularly preferred.

Specific examples of preferred polymeric compounds for use in the top coat material (2) are shown below.

In the formulas, $R^1$, $R^2$, $R^3$ and y are the same as $R^1$, $R^2$, $R^3$ and y respectively in the aforementioned formulas (Tc2-1) to (Tc2-3).

In the formulas, each of $R^{1a}$ and $R^{1b}$ independently represents the same as $R^1$ in formula (Tc2-1).

Each of $R^{2a}$ and $R^{2b}$ independently represents the same as $R^2$ in formula (Tc2-2).

Each of $y_1$ and $y_2$ independently represents the same as y in formula (Tc2-2).

Each of $R^{3a}$ and $R^{3b}$ independently represents the same as $R^3$ in formula (Tc2-3).

[Chemical Formula 10]

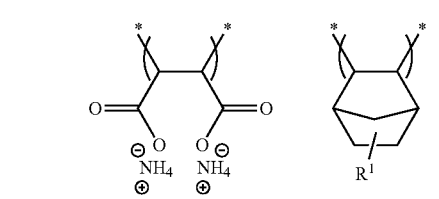
(TC1)

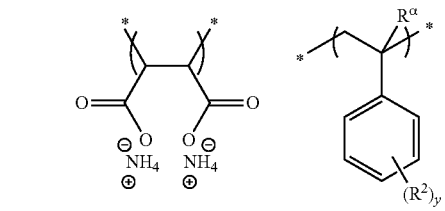
(TC2)

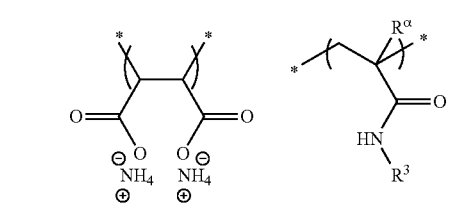
(TC3)

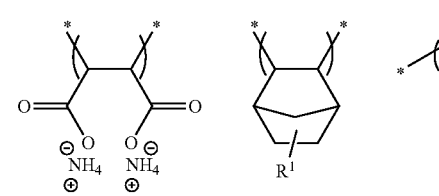
(TC4)

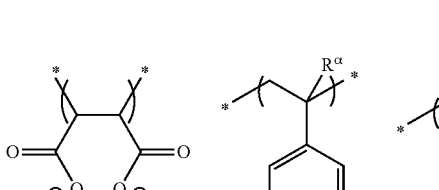
(TC5)

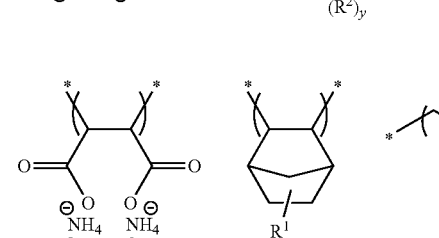
(TC6)

[Chemical Formula 11]

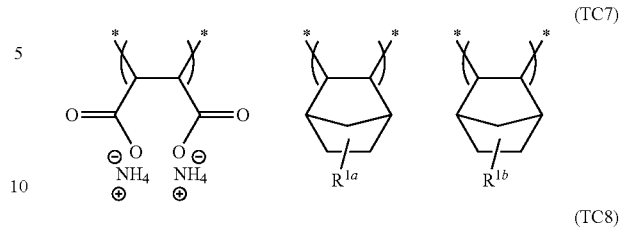
(TC7)

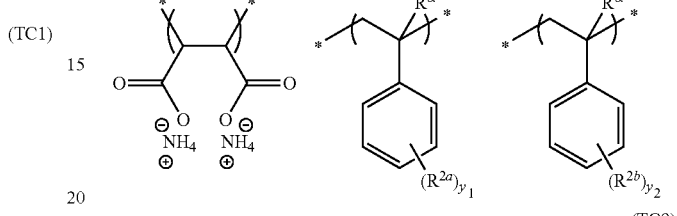
(TC8)

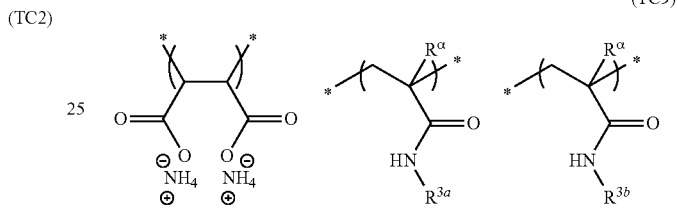
(TC9)

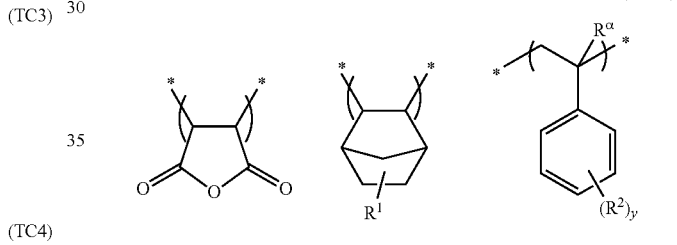
(TC10)

The weight-average molecular weight (Mw) (the polystyrene equivalent value determined by gel permeation chromatography (GPC)) of the polymeric compound used in the top coat material (2) is not particularly limited, but is preferably from 1,000 to 50,000, more preferably from 1,500 to 30,000, and most preferably from 2,000 to 30,000. Provided the weight-average molecular weight satisfies the above preferred range, the polymeric compound exhibits satisfactory solubility in solvents.

The molecular weight dispersity index (Mw/Mn) of the polymeric compound is not particularly limited, but is preferably from 1.0 to 6.0, more preferably from 1.0 to 5.0, and most preferably from 1.0 to 4.0.

The polymeric compound can be produced, for example, by polymerizing the monomers that give rise to each of the structural units by a conventional radical polymerization or the like using a radical polymerization initiator such as azobisisobutyronitrile (AIBN) or dimethyl azobisisobutyrate.

The amount of the polymeric compound within the top coat material (2) may be altered in accordance with the thickness of the top coat film that is to be formed. The concentration of the polymeric compound within the top coat material (2) is preferably from 0.1 to 15% by weight, and more preferably from 0.2 to 7% by weight.

(Optional Components)

If desired, the top coat material (2) may also include other miscible additives, such as the aforementioned surface energy control agent, in addition to the polymeric compound described above.

—Solvent

The top coat material (2) can be produced by dissolving the polymeric compound described above in a solvent.

This solvent may be any solvent capable of dissolving the components used to form a uniform solution, and specific examples include water, ammonia water (preferably 10 to 50% by weight), methanol, mixed solvents of ammonia water and methanol, mixed solvents of water and methanol, and mixed solvents of ammonia water and ethanol.

EXAMPLES

The present invention is described below in further detail based on a series of examples, but the present invention is in no way limited by these examples.

The block copolymers and top coat materials used in the examples are described below.

—Block Copolymers

A block copolymer (1) and a block copolymer (2) were used, each represented by chemical formula (BCP)-1 shown below, but having a different ratio (molar ratio) between the structural units.

[Chemical Formula 12]

(BCP)-1

$R^0$ = ethyl group

Block copolymer (1): forms a cylinder-shaped phase-separated structure (period $L_0$=23.4 nm). The polystyrene equivalent weight-average molecular weight (Mw) determined by gel permeation chromatography was 29,100, and the molecular weight dispersity index (Mw/Mn) was 1.04. Further, the ratio (molar ratio) between the structural units, determined by $^{13}$C-NMR, was 1/m=73.4/26.6.

Block copolymer (2): forms a lamellar phase-separated structure (period $L_0$=14.4 nm). The polystyrene equivalent weight-average molecular weight (Mw) determined by gel permeation chromatography was 18,800, and the molecular weight dispersity index (Mw/Mn) was 1.04. Further, the ratio (molar ratio) between the structural units, determined by $^{13}$C-NMR, was 1/m=96.6/3.4.

—Top Coat (TC) Materials

TC material (2-1): a 1.5% by weight polymeric compound solution containing a polymeric compound represented by chemical formula (TC)-1 shown below, and a solvent (a mixed solvent of ammonia water:methanol=1:3 (weight ratio)).

TC material (1-1): a 1.5% by weight polymeric compound solution containing 100 parts by weight of the polymeric compound represented by chemical formula (TC)-1 shown below, a solvent (a mixed solvent of ammonia water:methanol=1:3 (weight ratio)), and 100 parts by weight of ethylenediamine.

TC material (1-2): a 1.5% by weight polymeric compound solution containing 100 parts by weight of the polymeric compound represented by chemical formula (TC)-1 shown below, a solvent (a mixed solvent of ammonia water:methanol=1:3 (weight ratio)), and 200 parts by weight of ethylenediamine.

[Chemical Formula 13]

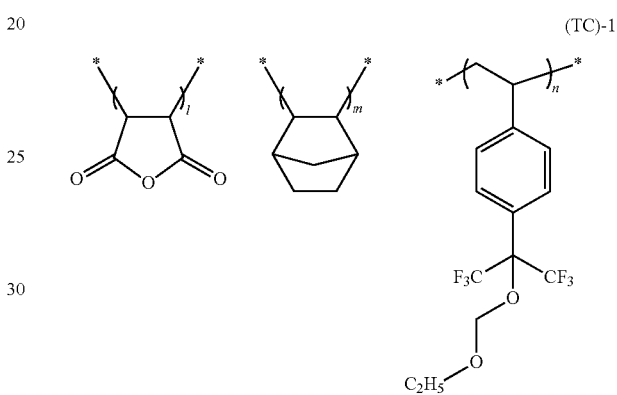

(TC)-1

Polymeric compound represented by chemical formula (TC)-1: the polystyrene equivalent weight-average molecular weight (Mw) determined by GPC measurement was 13,400, and the molecular weight dispersity index (Mw/Mn) was 2.7. Further, the ratio (molar ratio) between the structural units, determined by $^{13}$C-NMR, was 1/m/n=60/16/24.

<<Pattern Formation>>

Using the methods described below in each of the examples, a layer of the block copolymer (1) was subjected to phase separation to produce a structure containing a phase-separated structure, and the phase composed of the block of the structural unit derived from methyl methacrylate was then selectively removed from the structure to form a pattern. Subsequently, the cross-sectional shape of the obtained pattern was observed, and an evaluation was made to determine whether a lamellar or cylinder-shaped phase-separated pattern had been formed in the perpendicular direction relative to the wafer surface.

Comparative Example 1

A propylene glycol monomethyl ether acetate (PGMEA) solution containing the block copolymer (1) and PGMEA in which the solid content of the block copolymer (1) was 1.2% by weight, was spin-coated (rate of revolution: 1,500 rpm, 60 seconds) onto an 8-inch silicon wafer, and a bake treatment was then performed at 110° C. for 60 seconds, thereby forming a layer of the block copolymer (1) having a thickness of 20 nm.

Next, the layer of the block copolymer (1) was subjected to phase separation by thermal annealing at 180° C. for one hour under a stream of nitrogen, thus obtaining a structure containing a phase-separated structure.

Subsequently, using TCA-3822 (product name, manufactured by Tokyo Ohka Kogyo Co., Ltd.), the structure was subjected to an oxygen plasma treatment (200 sccm, 40 Pa, 200 W, 30 seconds, 40° C.), thereby selectively removing, from the structure, the phase composed of the block of the structural unit derived from methyl methacrylate, thus forming a pattern.

The cross-sectional shape of the obtained pattern was observed using a scanning electron microscope (accelerating voltage: 800 V, product name: SU8000 manufactured by Hitachi High-Technologies Corporation). As a result, a lamellar or cylinder-shaped phase-separated pattern arranged in the perpendicular direction relative to the wafer surface could not be confirmed.

Example 1

Step (1):

A propylene glycol monomethyl ether acetate (PGMEA) solution containing the block copolymer (1) and PGMEA in which the solid content of the block copolymer (1) was 1.2% by weight was spin-coated (rate of revolution: 1,500 rpm, 60 seconds) onto an 8-inch silicon wafer, and a bake treatment was then performed at 110° C. for 60 seconds, thereby forming a layer of the block copolymer (1) having a thickness of 20 nm.

Step (2):

The TC material (2-1) was applied to the layer of the block copolymer (1), thereby forming a top coat film having a thickness of 60 nm.

Step (3):

Next, the layer of the block copolymer (1) was subjected to phase separation by thermal annealing at 180° C. for one hour under a stream of nitrogen, thus obtaining a structure containing a phase-separated structure.

Step (4):

Subsequently, a solvent (a mixed solvent of ammonia water:methanol=1:3 (weight ratio)) was applied to the top coat film, thus removing the top coat film.

Using TCA-3822 (product name, manufactured by Tokyo Ohka Kogyo Co., Ltd.), the structure was then subjected to an oxygen plasma treatment (200 sccm, 40 Pa, 200 W, 30 seconds, 40° C.), thereby selectively removing, from the structure, the phase composed of the block of the structural unit derived from methyl methacrylate, thus forming a pattern.

The cross-sectional shape of the obtained pattern was observed using a scanning electron microscope (accelerating voltage: 800 V, product name: SU8000 manufactured by Hitachi High-Technologies Corporation). As a result, the formation of a cylinder-shaped phase-separated pattern arranged in the perpendicular direction relative to the wafer surface was confirmed.

Example 2

Steps (1) to (3) were performed in the same manner as in Example 1, thus obtaining a structure containing a phase-separated structure.

Step (4):

Subsequently, without removing the top coat film, TCA-3822 (product name, manufactured by Tokyo Ohka Kogyo Co., Ltd.) was used to subject the structure to an oxygen plasma treatment (200 sccm, 40 Pa, 200 W, 5 minutes, 40° C.), thereby selectively removing, from the structure, the top coat film and the phase composed of the block of the structural unit derived from methyl methacrylate, thus forming a pattern.

The cross-sectional shape of the obtained pattern was observed using a scanning electron microscope (accelerating voltage: 800 V, product name: SU8000 manufactured by Hitachi High-Technologies Corporation). As a result, the formation of a cylinder-shaped phase-separated pattern arranged in the perpendicular direction relative to the wafer surface was confirmed.

Example 3

With the exception of replacing the TC material (2-1) with the TC material (1-1), steps (1) to (3) were performed in the same manner as in Example 1, thus obtaining a structure containing a phase-separated structure.

Step (4):

Subsequently, without removing the top coat film, TCA-3822 (product name, manufactured by Tokyo Ohka Kogyo Co., Ltd.) was used to subject the structure to an oxygen plasma treatment (200 sccm, 40 Pa, 200 W, 5 minutes, 40° C.), thereby selectively removing, from the structure, the top coat film and the phase composed of the block of the structural unit derived from methyl methacrylate, thus forming a pattern.

The cross-sectional shape of the obtained pattern was observed using a scanning electron microscope (accelerating voltage: 800 V, product name: SU8000 manufactured by Hitachi High-Technologies Corporation). As a result, the formation of a cylinder-shaped phase-separated pattern arranged in the perpendicular direction relative to the wafer surface was confirmed.

Example 4

With the exception of replacing the TC material (2-1) with the TC material (1-2), steps (1) to (3) were performed in the same manner as in Example 1, thus obtaining a structure containing a phase-separated structure.

Step (4):

Subsequently, without removing the top coat film, a TCA-3822 (product name, manufactured by Tokyo Ohka Kogyo Co., Ltd.) was used to subject the structure to an oxygen plasma treatment (200 sccm, 40 Pa, 200 W, 5 minutes, 40° C.), thereby selectively removing, from the structure, the top coat film and the phase composed of the block of the structural unit derived from methyl methacrylate, thus forming a pattern.

The cross-sectional shape of the obtained pattern was observed using a scanning electron microscope (accelerating voltage: 800 V, product name: SU8000 manufactured by Hitachi High-Technologies Corporation). As a result, the formation of a cylinder-shaped phase-separated pattern arranged in the perpendicular direction relative to the wafer surface was confirmed.

Comparative Example 2

With the exception of replacing the block copolymer (1) with the block copolymer (2), a pattern was formed in the same manner as in Comparative Example 1.

The cross-sectional shape of the obtained pattern was observed using a scanning electron microscope (accelerating voltage: 800 V, product name: SU8000 manufactured by Hitachi High-Technologies Corporation). As a result, a lamellar or cylinder-shaped phase-separated pattern arranged in the perpendicular direction relative to the wafer surface could not be confirmed.

Example 5

With the exception of replacing the block copolymer (1) with the block copolymer (2), steps (1) to (4) were performed in the same manner as in Example 1, thus forming a pattern.

The cross-sectional shape of the obtained pattern was observed using a scanning electron microscope (accelerating voltage: 800 V, product name: SU8000 manufactured by Hitachi High-Technologies Corporation). As a result, the formation of a lamellar phase-separated pattern arranged in the perpendicular direction relative to the wafer surface was confirmed.

Example 6

With the exception of replacing the block copolymer (1) with the block copolymer (2), steps (1) to (4) were performed in the same manner as in Example 3, thus forming a pattern.

The cross-sectional shape of the obtained pattern was observed using a scanning electron microscope (accelerating voltage: 800 V, product name: SU8000 manufactured by Hitachi High-Technologies Corporation). As a result, the formation of a lamellar phase-separated pattern arranged in the perpendicular direction relative to the wafer surface was confirmed.

Example 7

With the exception of replacing the block copolymer (1) with the block copolymer (2), steps (1) to (4) were performed in the same manner as in Example 4, thus forming a pattern.

The cross-sectional shape of the obtained pattern was observed using a scanning electron microscope (accelerating voltage: 800 V, product name: SU8000 manufactured by Hitachi High-Technologies Corporation). As a result, the formation of a lamellar phase-separated pattern arranged in the perpendicular direction relative to the wafer surface was confirmed.

From the above results, it was found that, by using the method of the present invention, namely a method of using a specific top coat material to provide a top coat film on a layer of a block copolymer having a block of a POSS structure-containing structural unit, and subsequently performing thermal annealing to effect phase separation, a structure containing a phase-separated structure can be obtained, and a pattern of very fine dimensions can be formed.

In other words, in the present invention, by using a specific top coat material, a structure containing a phase-separated structure of a block copolymer having a block of a POSS structure-containing structural unit can be formed by thermal annealing. As a result, the throughput and the mass-producibility can be improved as compared to the case where solvent annealing is used.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

The invention claimed is:

1. A method of producing a structure containing a phase-separated structure, the method comprising:
   (1) forming, on a substrate, a layer containing a block copolymer having a block of a polyhedral oligomeric silsesquioxane structure-containing structural unit,
   (2) forming a top coat film by applying, to the layer containing the block copolymer, a top coat material comprising a polymeric compound having a structural unit (Tc1) which undergoes a change in s polarity upon heating and a structural unit (Tc2) which controls a surface energy of the layer containing the block copolymer, and
   (3) subjecting the layer containing the block copolymer with the top coat film formed thereon to phase separation by thermal annealing.

2. The method according to claim 1, wherein the polyhedral oligomeric silsesquioxane structure-containing structural unit is a structural unit represented by general formula (a0-1) shown below:

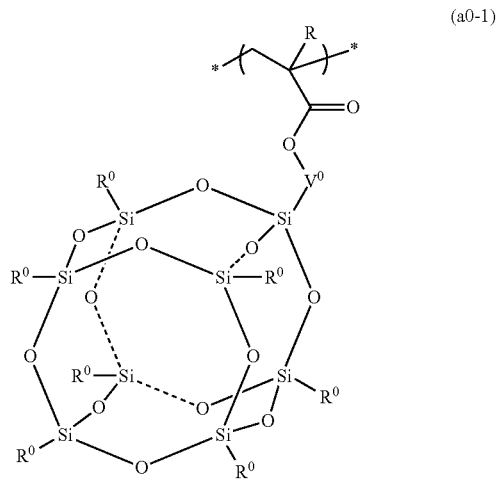

wherein R represents a hydrogen atom, an alkyl group of 1 to 5 carbon atoms or a halogenated alkyl group of 1 to 5 carbon atoms; $V^0$ represents a divalent hydrocarbon group which may have a substituent; $R^0$ represents a monovalent hydrocarbon group which may have a substituent, provided that a plurality of $R^0$ groups may be identical or different, and * indicates a valence bond.

3. The method according to claim 1, wherein the top coat material further comprises a surface energy control agent which controls a surface energy of the layer containing the block copolymer.

4. The method according to claim 2, wherein the top coat material further comprises a surface energy control agent which controls a surface energy of the layer containing the block copolymer.

5. The method according to claim 3, wherein the surface energy control agent is a diamine or a triamine.

6. The method according to claim 4, wherein the surface energy control agent is a diamine or a triamine.

7. The method according to claim 1, wherein the structural unit (Tc1) is a structural unit represented by chemical formula (Tc1-1) shown below or a structural unit represented by chemical formula (Tc1-2) shown below:

(Tc1-1)

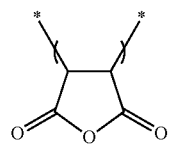

(Tc1-2)

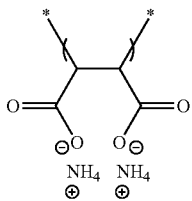

wherein * indicates a valence bond.

8. The method according to claim 2, wherein the structural unit (Tc1) is a structural unit represented by chemical formula (Tc1-1) shown below or a structural unit represented by chemical formula (Tc1-2) shown below:

(Tc1-1)

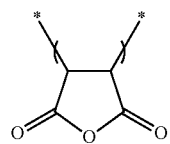

(Tc1-2)

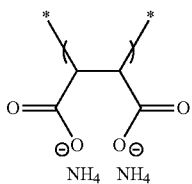

wherein * indicates a valence bond.

9. The method according to claim 1, wherein the structural unit (Tc2) is at least one type of structural unit selected from the group consisting of structural units represented by general formula (Tc2-1) shown below, structural units represented by general formula (Tc2-2) shown below, and structural units represented by general formula (Tc2-3) shown below:

(Tc2-1)

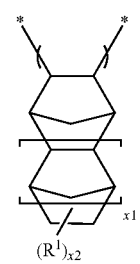

(Tc2-2)

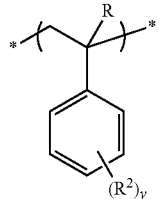

(Tc2-3)

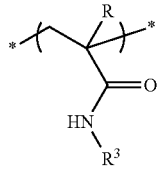

wherein x1 represents 0 or 1; $R^1$ represents a fluorine atom, or a hydrocarbon group which may contain a fluorine atom or an oxygen atom; x2 is an integer of 0 to 4; R represents a hydrogen atom, an alkyl group of 1 to 5 carbon atoms or a halogenated alkyl group of 1 to 5 carbon atoms, provided that a plurality of R groups may be identical or different; $R^2$ represents a fluorine atom, or a hydrocarbon group which may contain a fluorine atom or an oxygen atom; y is an integer of 0 to 3; $R^3$ represents a hydrocarbon group which may have a substituent, wherein the substituent in $R^3$ is a fluorine atom, or a hydrocarbon group which may contain a fluorine atom or an oxygen atom; and * indicates a valence bond.

10. The method according to claim 2, wherein the structural unit (Tc2) is at least one type of structural unit selected from the group consisting of structural units represented by general formula (Tc2-1) shown below, structural units represented by general formula (Tc2-2) shown below, and structural units represented by general formula (Tc2-3) shown below:

(Tc2-1)

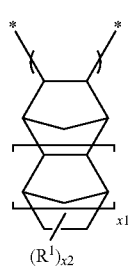

(Tc2-2)

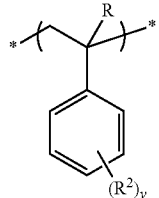

(Tc2-3)

wherein x1 represents 0 or 1; $R^1$ represents a fluorine atom, or a hydrocarbon group which may contain a fluorine atom or an oxygen atom; x2 is an integer of 0 to 4; R represents a hydrogen atom, an alkyl group of 1 to 5 carbon atoms or a halogenated alkyl group of 1 to 5 carbon atoms, provided that a plurality of R groups may be identical or different; $R^2$ represents a fluorine atom, or a hydrocarbon group which may contain a fluorine atom or an oxygen atom; y is an integer of 0 to 3; $R^3$ represents a hydrocarbon group which may have a substituent, wherein the substituent in $R^3$ is a fluorine atom, or a hydrocarbon group which may contain a fluorine atom or an oxygen atom; and * indicates a valence bond.

11. A method of forming a pattern, the method comprising:
producing a structure containing a phase-separated structure by the method of any one of claims 1 to 6 and 7 to 10, and
forming a pattern by selectively removing a phase composed of at least one type of block from the structure containing a phase-separated structure.

12. The method of forming a pattern according to claim 11, wherein the pattern is formed by removing the top coat film, and subsequently selectively removing the phase composed of at least one type of block from the structure containing a phase-separated structure.

* * * * *